(12) United States Patent
Park et al.

(10) Patent No.: US 9,099,399 B2
(45) Date of Patent: Aug. 4, 2015

(54) METHODS OF FORMING FINE PATTERNS FOR SEMICONDUCTOR DEVICES

(71) Applicant: Samsung Electronics Co., Ltd., Suwon-si, Gyeonggi-do (KR)

(72) Inventors: Joonsoo Park, Seongnam-si (KR); Soonmok Ha, Hwaseong-si (KR); Eunshoo Han, Gyeonggi-do (KR); Seongho Moon, Yongin-si (KR); Sung-Wook Hwang, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/467,400

(22) Filed: Aug. 25, 2014

(65) Prior Publication Data

US 2015/0104946 A1    Apr. 16, 2015

(30) Foreign Application Priority Data

Oct. 10, 2013   (KR) .................... 10-2013-0120903

(51) Int. Cl.
| | | |
|---|---|---|
| H01L 21/02 | (2006.01) | |
| H01L 21/306 | (2006.01) | |
| H01L 21/308 | (2006.01) | |
| H01L 21/311 | (2006.01) | |

(52) U.S. Cl.
CPC ...... *H01L 21/30604* (2013.01); *H01L 21/3086* (2013.01); *H01L 21/3088* (2013.01); *H01L 21/31111* (2013.01)

(58) Field of Classification Search
CPC ............... H01L 21/02; H01L 21/0231; H01L 21/02356; H01L 21/0273; H01L 21/02118; H01L 21/0337; H01L 21/3088; H01L 21/3086; H01L 33/48–33/52

USPC .................................. 438/702, 736–781, 832
See application file for complete search history.

(56) References Cited

U.S. PATENT DOCUMENTS

| | | | |
|---|---|---|---|
| 7,767,265 B2 | 8/2010 | Yoshida et al. | |
| 7,931,819 B2 | 4/2011 | Kihara et al. | |
| 8,039,196 B2 | 10/2011 | Kim et al. | |
| 8,226,838 B2 | 7/2012 | Cheng et al. | |
| 8,263,323 B2 | 9/2012 | Yoon et al. | |
| 8,273,668 B2 | 9/2012 | Yoon et al. | |
| 8,399,174 B2 | 3/2013 | Kim et al. | |
| 8,808,557 B1 * | 8/2014 | Seino et al. | 216/41 |
| 2008/0041818 A1 * | 2/2008 | Kihara et al. | 216/41 |

(Continued)

FOREIGN PATENT DOCUMENTS

| | | |
|---|---|---|
| JP | 2008-036491 | 2/2008 |
| JP | 2010-056256 | 3/2010 |

(Continued)

*Primary Examiner* — Michael Lebentritt
(74) *Attorney, Agent, or Firm* — Myers Bigel Sibley & Sajovec, P.A.

(57) ABSTRACT

Methods of forming fine patterns for semiconductor devices are provided. A method may include sequentially forming a lower layer and a mask layer having first openings on a substrate, forming pillars to fill the first openings and protrude upward from a top surface of the mask layer, forming a block copolymer layer on the substrate with the pillars, performing a thermal treatment to the block copolymer layer to form a first block portion and second block portions, removing the second block portions to form guide openings exposing the mask layer, and etching the mask layer exposed by the guide openings to form second openings.

20 Claims, 22 Drawing Sheets

(56) References Cited

U.S. PATENT DOCUMENTS

| | | | |
|---|---|---|---|
| 2009/0127095 A1* | 5/2009 | Iwata et al. | 204/192.3 |
| 2009/0191713 A1 | 7/2009 | Yoon et al. | |
| 2010/0167214 A1* | 7/2010 | Yoon et al. | 430/323 |
| 2011/0081777 A1* | 4/2011 | Yoon et al. | 438/674 |
| 2011/0220936 A1* | 9/2011 | Fujimoto et al. | 257/98 |
| 2012/0067843 A1* | 3/2012 | Watanabe et al. | 216/22 |
| 2012/0231213 A1* | 9/2012 | Yamamoto et al. | 428/119 |
| 2012/0289051 A1* | 11/2012 | Kim et al. | 438/702 |
| 2013/0075360 A1 | 3/2013 | Nakamura et al. | |
| 2013/0078813 A1* | 3/2013 | Chiba et al. | 438/702 |
| 2013/0092219 A1* | 4/2013 | Tsutsumi et al. | 136/255 |
| 2013/0295772 A1* | 11/2013 | Kim et al. | 438/694 |
| 2014/0022521 A1* | 1/2014 | Harumoto et al. | 355/27 |
| 2014/0187054 A1* | 7/2014 | Park et al. | 438/781 |
| 2014/0238956 A1* | 8/2014 | Namie et al. | 216/83 |
| 2014/0242799 A1* | 8/2014 | Takakuwa et al. | 438/702 |
| 2014/0295669 A1* | 10/2014 | Kawanishi et al. | 438/702 |
| 2014/0377956 A1* | 12/2014 | Nakajima et al. | 438/703 |
| 2015/0004438 A1* | 1/2015 | Takizawa et al. | 428/832 |

FOREIGN PATENT DOCUMENTS

| | | |
|---|---|---|
| KR | 1020090080395 | 7/2009 |
| KR | 1020130034778 | 4/2013 |

* cited by examiner

METHODS OF FORMING FINE PATTERNS FOR SEMICONDUCTOR DEVICES

CROSS-REFERENCE TO RELATED APPLICATIONS

This U.S. non-provisional patent application claims priority under 35 U.S.C. §119 to Korean Patent Application No. 10-2013-0120903, filed on Oct. 10, 2013, in the Korean Intellectual Property Office, the entire contents of which are hereby incorporated by reference.

FIELD

Example embodiments of the inventive concept relate to a semiconductor device, and in particular, to methods of forming fine patterns for semiconductor devices.

BACKGROUND

In order to realize a highly-integrated semiconductor device, it may be necessary to have a method of forming fine patterns. For example, to integrate more and more devices in a given area, a size of each pattern should be as small as possible. In other words, patterns should be formed in such a way that a pitch thereof or a sum of a width of each pattern and a space between adjacent two of the patterns is reduced. However, as semiconductor device design rules are drastically reducing, resolution in a photolithography process is being stretched to the limit, and thus, it becomes more and more difficult to form patterns having a fine pitch.

SUMMARY

Example embodiments of the inventive concept provide methods of forming patterns having a fine pitch.

Other example embodiments of the inventive concept provided methods of forming patterns that are regularly or uniformly arranged.

According to example embodiments of the inventive concept, a patterning method may include sequentially forming a lower layer and a mask layer having first openings on a substrate, forming pillars to fill the first openings and protrude upward from a top surface of the mask layer, forming a block copolymer layer on the substrate with the pillars, performing a thermal treatment to the block copolymer layer to form a first block portion and second block portions, removing the second block portions to form guide openings exposing the mask layer, and etching the mask layer exposed by the guide openings to form second openings. The second block portions may be formed between the pillars and the first block portion may be formed between the pillars and the second block portions.

In example embodiments, each of the second openings may be formed between at least three of the first openings disposed adjacent to each other, and the at least three of the first openings may be two-dimensionally arranged.

In example embodiments, each of the second openings may be spaced apart from the at least three of the first openings adjacent thereto, by substantially the same space.

In example embodiments, the at least three of the first openings may be formed to be positioned at vertexes, respectively, of a triangle.

In example embodiments, the at least three of the first openings may include four first openings positioned at vertexes, respectively, of a tetragon.

In example embodiments, the method may further include etching the lower layer exposed by the mask layer.

In example embodiments, the forming of the mask layer may include forming the mask layer on the lower layer, forming a buffer mask layer having buffer openings, on the mask layer, forming spacers on sidewalls of the buffer openings, and etching portions of the mask layer exposed by the buffer openings provided with the spacers to form the first openings in the mask layer.

In example embodiments, the forming of the pillars may include forming a pillar layer to fill the buffer openings and the first openings, planarizing the pillar layer to expose the buffer mask layer and form the pillars, and removing the buffer mask layer.

In example embodiments, the method may further include forming a seed layer on the substrate with the pillars, before the forming of the block copolymer layer. The seed layer is formed to cover conformally a top surface of the mask layer and sidewalls of the pillars.

In example embodiments, the second block portions may be formed spaced apart from a top surface of the mask layer, and the first block portion may be extended to between bottom surfaces of the second block portions and the top surface of the mask layer.

In example embodiments, the second openings may be formed to have substantially the same shape as the first openings.

In example embodiments, each of the second openings may be formed to have a circular shape.

In example embodiments, the second block portions may include a material different from the first block portion, and the first block portion is formed to enclose the pillars.

In example embodiments, a patterning method may include sequentially forming a lower layer, a mask layer and a buffer mask layer on a substrate, the buffer mask layer having buffer openings, forming spacers on inner sidewalls of the buffer openings, etching portions of the mask layer exposed by the spacers in the buffer openings to form first openings in the mask layer, forming pillars to fill the first openings and the buffer openings between the spacers and removing the buffer mask layer. The method may further include forming a first block copolymer portion to fill gap regions on the mask layer between outer sidewalls of the spacers, forming second block copolymer portions of a material different than the first block copolymer portion at equal distances from the pillars and removing the second block copolymer portions to form guide openings exposing the mask layer.

In example embodiments, forming the pillars may include filling the buffer openings and the first openings with a pillar layer and planarizing the pillar layer to expose the buffer mask layer and top surfaces of the pillars.

In example embodiments, a closest three of the pillars to each of the second block copolymer portions may not be disposed in a straight line.

In example embodiments, top surfaces of the second block copolymer portions may be circular in shape and the second block copolymer portions may be surrounded by the first block copolymer portion and two-dimensionally arranged to be positioned at vertexes of at least one of a triangle pattern and a hexagon pattern.

In example embodiments, the method may also include forming a seed layer comprising polymer materials conformally on a top surface of the mask layer, top surfaces of the pillars and outer sidewalls of the spacers and forming the first block copolymer portion on the seed layer.

In example embodiments, a patterning method may include sequentially forming a lower layer and a mask layer on a substrate, the mask layer having first openings, forming pillars to fill the first openings and protrude upward from a top surface of the mask layer, forming a seed layer comprising polymer materials conformally on a top surface of the mask layer, top surfaces of the pillars and outer sidewalls of the spacers, forming a first block copolymer portion on the seed layer to fill gap regions on the seed layer between outer sidewalls of the spacers, forming second block copolymer portions different than the first block copolymer portion at equal distances from the pillars and removing the second block copolymer portions to form guide openings exposing the mask layer.

In example embodiments, the second block copolymer portions may be formed spaced apart from a top surface of the seed layer, and a portion of the first block copolymer portion may extend between bottom surfaces of the second block copolymer portions and the top surface of the seed layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 1A through 8A are plan views illustrating a patterning method according to example embodiments of the inventive concept.

FIGS. 1B through 8B are sectional views taken along line I-I' of FIGS. 1A through 8A, respectively.

FIGS. 9A through 13A are plan views illustrating a patterning method according to other example embodiments of the inventive concept.

FIGS. 9B through 13B are sectional views taken along line I-I' of FIGS. 9A through 13A, respectively.

FIG. 14A through 16A are plan views illustrating a patterning method according to still other example embodiments of the inventive concept.

FIGS. 14B through 16B are sectional views taken along line I-I' of FIGS. 14A through 16A, respectively.

Figure 1A:
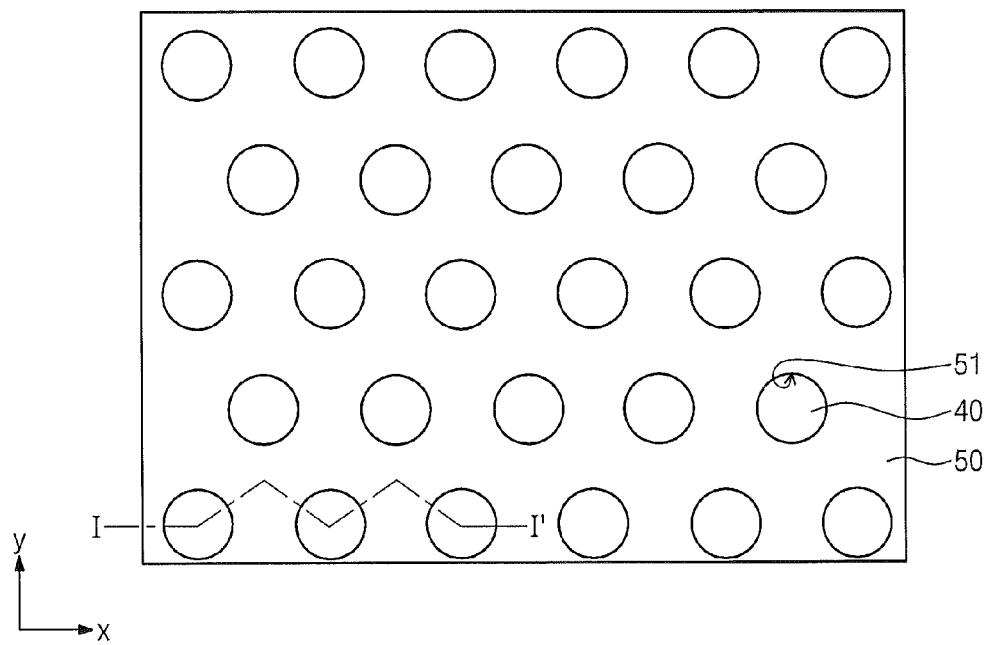

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1A through 8A are plan views illustrating a patterning method according to example embodiments of the inventive concept. FIGS. 1B through 8B are sectional views taken along line I-I' of FIGS. 1A through 8A, respectively.

Figure 1B:
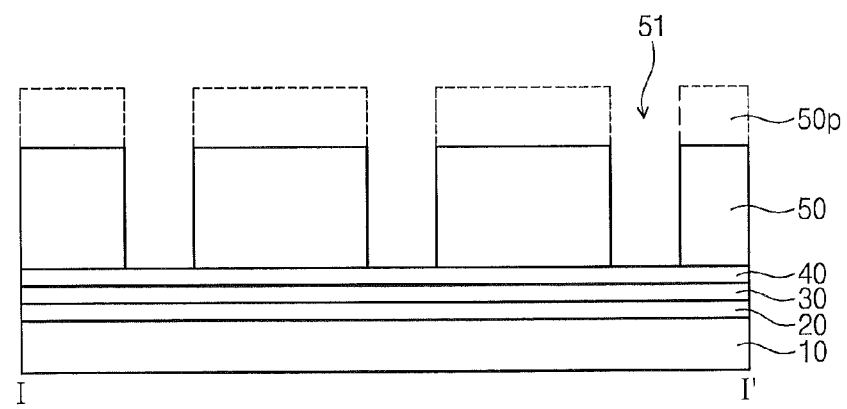

Referring to FIGS. 1A and 1B, a lower layer 20, an etch stop layer 30, a mask layer 40, and a buffer mask layer 50 with buffer openings 51 may be sequentially formed on a substrate 10. In example embodiments, the lower layer 20 may be formed of or include at least one of semiconductor, conductive, or insulating materials. Furthermore, the lower layer 20 may be formed to have a single-layered structure or a multi-layered structure having plurality of stacked layers. The etch stop layer 30 may be formed of a material having an etch selectivity with respect to the lower layer 20 and the mask layer 40. In certain embodiments, the etch stop layer 30 may be omitted.

The mask layer 40 may be formed on the etch stop layer 30. The mask layer 40 may be formed of at least one of materials having an etch selectivity with respect to the lower layer 20 in a process of etching the lower layer 20. In certain embodiments, the mask layer 40 may be formed of or include at least one of silicon, polysilicon, $SiO_2$, SiON, $Si_3N_4$, SiCN, or SiC.

The buffer mask layer 50 may be formed on the mask layer 40. The buffer mask layer 50 may be formed of a material having an etch selectivity with respect to the mask layer 40. For example, the buffer mask layer 50 may be formed of or include at least one of silicon, polysilicon, $SiO_2$, SiON, $Si_3N_4$, SiCN, or SiC.

A photoresist layer 50p may be formed on the buffer mask layer 50. The photoresist layer 50p may be formed to expose at least a portion of the buffer mask layer 50. The buffer mask layer 50 may be etched using the photoresist layer 50p as an etch mask, thereby forming the buffer openings 51 in the buffer mask layer 50. The buffer openings 51 may be formed to expose the mask layer 40. In certain embodiments, the buffer openings 51 may be formed to have a width and a pitch that are dependent on an attainable resolution or a critical dimension of a photolithography process. Thereafter, the photoresist layer 50p may be removed.

The buffer openings 51 may be shaped like a circle, as shown in FIG. 1A. The buffer openings 51 constituting two adjacent rows (e.g., one of even-numbered rows and one odd-numbered row adjacent thereto) may be arranged in a zigzag manner along an x-axis direction.

Figure 2A:
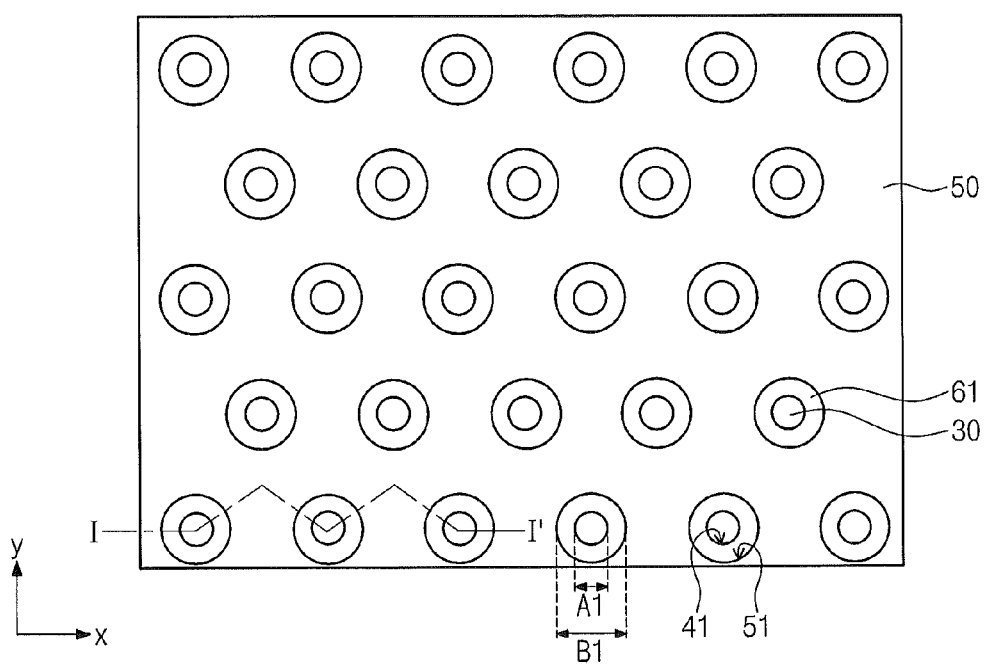
Figure 2B:
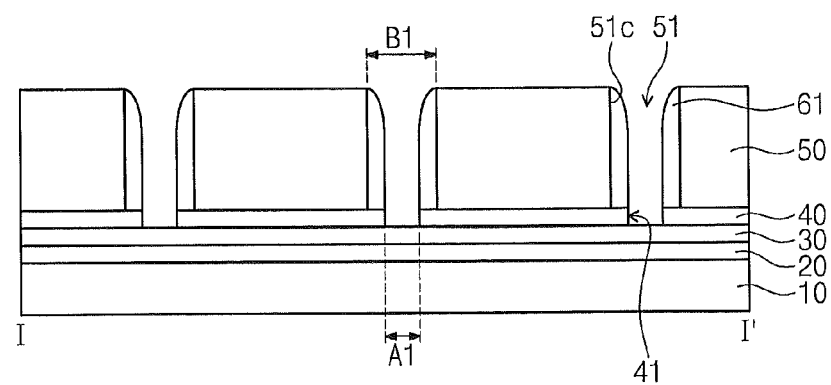

Referring to FIGS. 2A and 2B, spacers 61 may be formed on sidewalls 51c of the buffer openings 51, respectively. The spacers 61 may be formed of or include at least one of inorganic materials (e.g., silicon, polysilicon, $SiO_2$, SiON, $Si_3N_4$, SiCN, or SiC). The mask layer 40 exposed by the buffer openings 51 may be etched using the spacers 61 as an etch mask. Accordingly, first openings 41 may be formed in the mask layer 40 to expose the etch stop layer 30. In the case where the etch stop layer 30 is omitted, the first openings 41 may be formed to expose the lower layer 20. Since the spacers 61 are formed on the sidewalls 51c of the buffer openings 51, each of the first openings 41 may have a width A1 that is smaller than a width B1 of a corresponding one of the buffer openings 51, when measured at the same level. The width A1 of the first opening 41 may be controlled by a thickness of the spacer 61. Alternatively, the formation of the spacers 61 may be omitted.

Referring to FIG. 2A, the first openings 41 may be formed to constitute a plurality of rows. The first openings 41 constituting two adjacent rows may be arranged in a zigzag manner along the x-axis direction. For example, each of the first openings 41 constituting even-numbered rows may be disposed at a position shifted from a corresponding one of the first openings 41 constituting odd-numbered rows by a half pitch in the x-axis direction. In certain embodiments, a space between an adjacent pair of the first openings 41 in the x-axis direction may be substantially equal to that of an adjacent pair of the first openings 41 in a diagonal direction (for example, at an angle of 45 degree to the x-axis). For example, at least three of the first openings 41, which are two-dimensionally arranged adjacent to each other, may be positioned at vertexes of a triangle (e.g., isosceles or regular triangle). The first openings 41 may be formed to have the same or similar arrangement as that of the buffer openings 51. The first openings 41 may have a circular shape, when viewed in plan view.

Figure 3A:
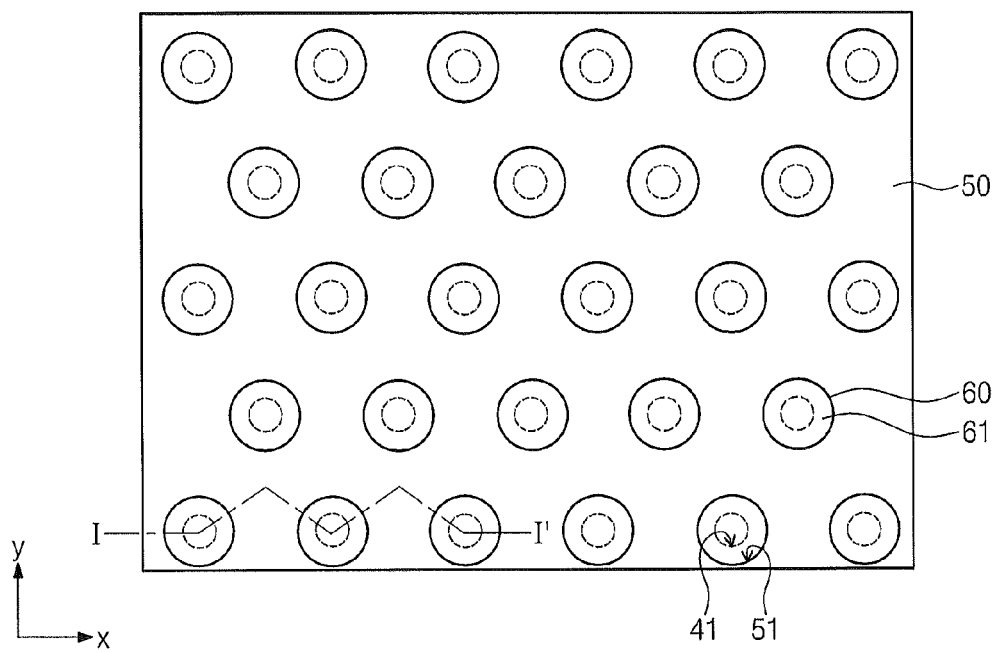
Figure 3B:
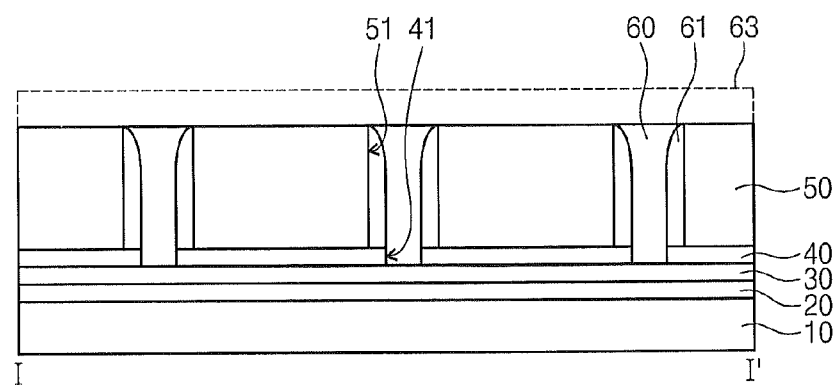

Referring to FIGS. 3A and 3B, pillars 60 may be formed on the lower layer 20 to fill the first openings 41 and the buffer openings 51. For example, a pillar layer 63 may be formed to fill the first openings 41 and the buffer openings 51. The pillar layer 63 may cover the mask layer 40. The pillar layer 63 may be formed of or include at least one of inorganic materials (e.g., silicon, polysilicon, $SiO_2$, SiON, $Si_3N_4$, SiCN, or SiC). The pillar layer 63 may include the same material as the spacers 61. The pillar layer 63 may be planarized to expose the buffer mask layer 50. As a result of the planarization process, the pillar layer 63 may be divided into a plurality of the pillars 60. The pillars 60 may include the spacers 61. The pillars 60 may be formed in the buffer openings 51 and the first openings 41 and be spaced apart from each other. For example, as shown in FIG. 2A, each of the pillars 60 may be formed to have a circular shape. The pillars 60 may be arranged to have the same or similar arrangement as that of the first openings 41. For example, the pillars 60 constituting two adjacent rows (e.g., one of even-numbered rows and one odd-numbered row adjacent thereto) may be arranged in a zigzag manner along the x-axis direction.

Figure 4A:
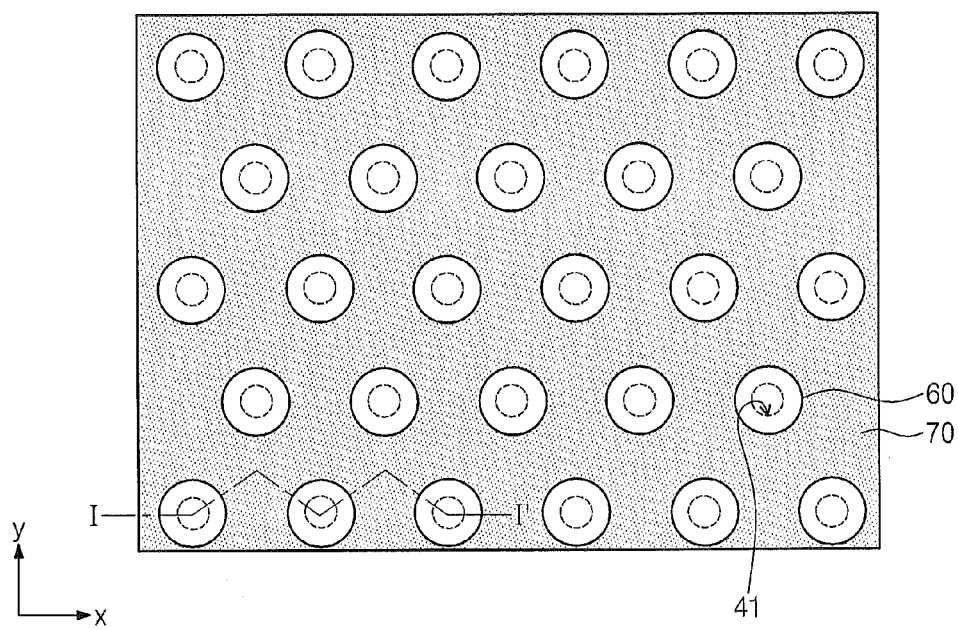
Figure 4B:
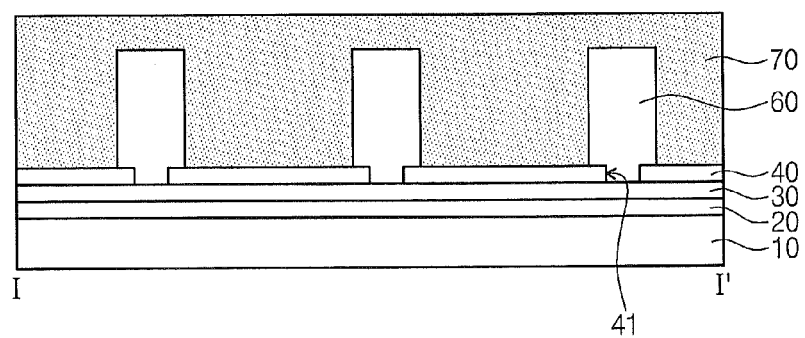

Referring to FIGS. 4A and 4B, a block copolymer layer 70 may be formed on the substrate 10 to fill gap regions between the pillars 60. Before the formation of the block copolymer layer 70, the buffer mask layer 50 may be removed. In certain embodiments, the block copolymer layer 70 may be formed by coating block copolymer on the substrate 10. The block copolymer may consist of at least two polymer blocks covalently bonded to each other. In certain embodiments, at least one of the polymer blocks may have different characteristics from the others. The polymer blocks may be randomly mixed in the block copolymer layer 70.

Figure 5A:
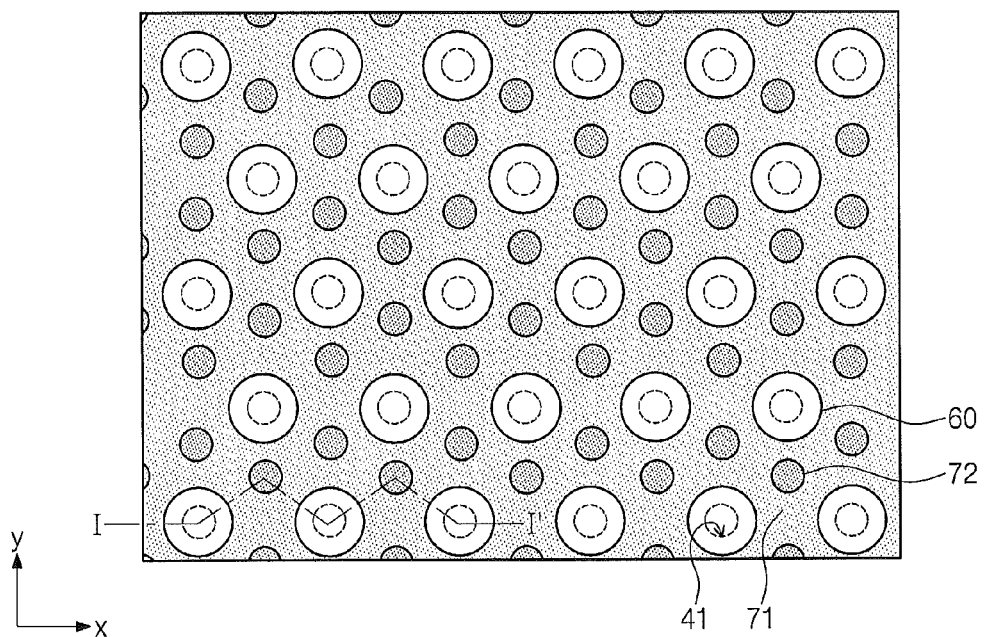
Figure 5B:
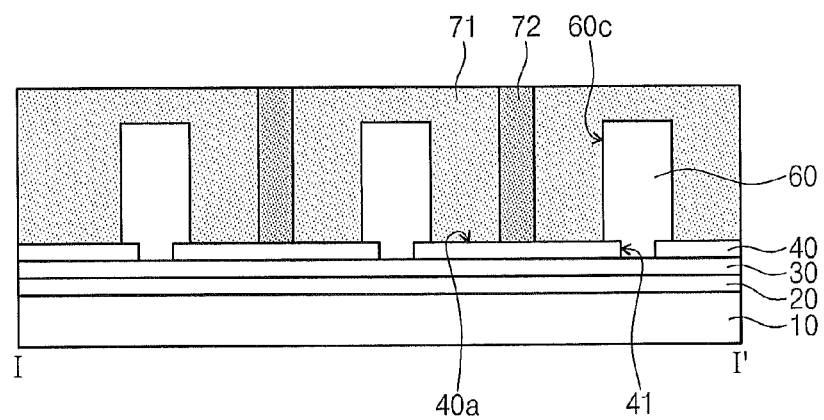

Referring to FIGS. 5A and 5B, a phase separation process may be performed to form a first block portion 71 and second block portions 72 from the different polymer blocks in the block copolymer layer 70. For example, during a thermal treatment, the polymer blocks in the block copolymer layer 70 may be interacted with the pillars 60 or a top surface 40a of the mask layer 40, thereby forming the first block portion 71 and the second block portions 72. Since the pillars 60 include the inorganic material, it is possible to prevent the pillars 60 from being damaged during the thermal treatment process. The first block portion 71 may contain at least one polymer having different property from the second block portions 72. The pillars 60 may contain a different material from the mask layer 40. The first block portion 71 may have a higher affinity for the pillars 60, compared with the second block portions 72. Accordingly, the first block portion 71 may be formed to enclose sidewalls 60c of the pillars 60. The first block portion 71 may be interposed between the second block portions 72 and the pillars 60. The second block portions 72 may be interposed between the pillars 60. A width of each of the second block portions 72 may be controlled by adjusting a space between the pillars 60. As shown in FIG. 5A, each of the second block portions 72 may be formed between at least three pillars 60 adjacent to each other. The at least three pillars 60 adjacent to each other may be two-dimensionally arranged. In other words, the at least three pillars 60 adjacent to each other may not be disposed on a straight line. For example, the three pillars 60 adjacent to each other may be positioned at vertexes of a triangle (e.g., isosceles or regular triangle). Each of the second block portions 72 may be disposed spaced apart from the three pillars 60, by substantially the same distance. In the case where the pillars 60 are omitted, it may be difficult to control positions and arrangement of the second block portions 72. For example, if one of the second block portions 72 is misaligned, the misaligned one of the second block portions 72 may have a bad influence on the arrangement of the others. By contrast, according to example embodiments of the inventive concept, positions of the second block portions 72 may be controlled with respect to the pillars 60 disposed adjacent thereto. Accordingly, it is possible to suppress the arrangement of the second block portions 72 from being distorted by a misaligned one of the second block portions 72. In other words, according to example embodiments of the inventive concept, it is possible to improve uniformity in pitch of the second block portions 72, compared with the case that the pillars 60 are omitted. The second block portions 72 may be disposed to have a honeycomb-shaped arrangement. For example, the second block portions 72 may be positioned at vertexes of a hexagon. In certain embodiments, each of the second block portions 72 may be shaped like a circle.

Figure 5C:
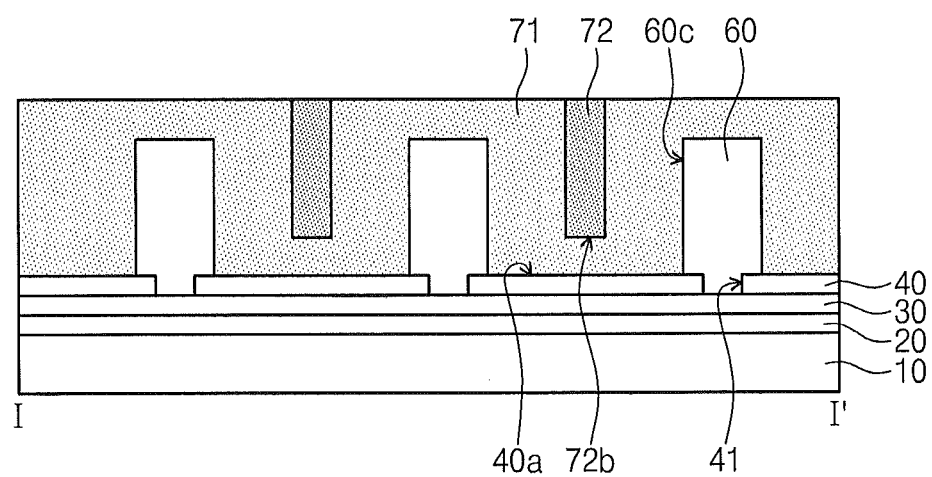
FIG. 5C is a sectional view taken along line I-I' of FIG. 5A to illustrate a method of forming first and second block portions according to other example embodiments of the inventive concept.

FIG. 5C is a sectional view taken along line I-I' of FIG. 5A to illustrate a method of forming first and second block portions according to other example embodiments of the inventive concept.

Referring to FIG. 5C, a thermal treatment process may be performed to the block copolymer layer 70 to form the first block portion 71 and the second block portions 72. The first block portion 71 may be conformally formed on the mask layer 40 and the pillars 60. For example, the first block portion 71 may be provided on the sidewalls 60c of the pillars 60 and be extended to regions between bottom surfaces 72b of the second block portions 72 and the top surface 40a of the mask layer 40. The second block portions 72 may be formed on the first block portion 71 and be spaced apart from the top surface 40a of the mask layer 40. The second block portions 72 may be enclosed by the first block portion 71. In example embodiments, the mask layer 40 may include a material that is the same as or different from the pillars 60. The first block portion 71 may have a higher affinity for the pillars 60 and the mask layer 40, compared with the second block portions 72. In other example embodiments, a shape and/or width of each of the second block portions 72 can be controlled by adjusting composition ratio or the kinds of the polymer blocks contained in the block copolymer layer 70. Each of the second block portions 72 may be formed between at least three pillars 60 adjacent to each other.

Figure 6A:
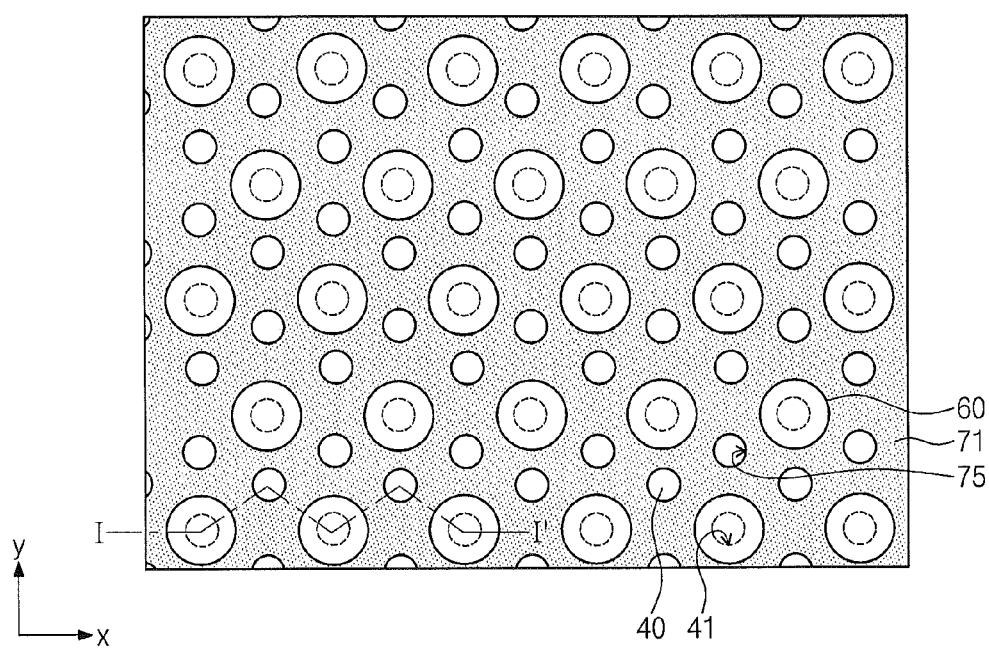
Figure 6B:
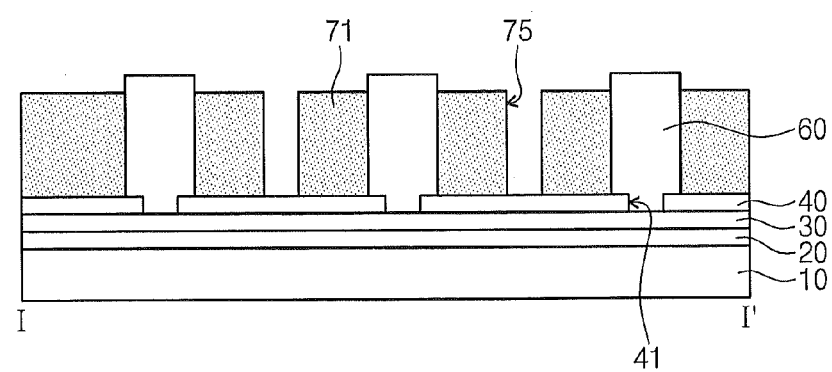

Referring to FIGS. 6A and 6B, the second block portions 72 may be removed to form guide openings 75. The guide openings 75 may be formed to expose the mask layer 40. For example, the second block portions 72 may be removed by an etching process. The removal of the second block portions 72 may be performed using a wet or dry development. The second block portions 72 may be easily removed by the wet development, compared with the first block portion 71. In certain embodiments, the second block portions 72 may be irradiated by ultraviolet light (UV), before the etching process.

Figure 7A:
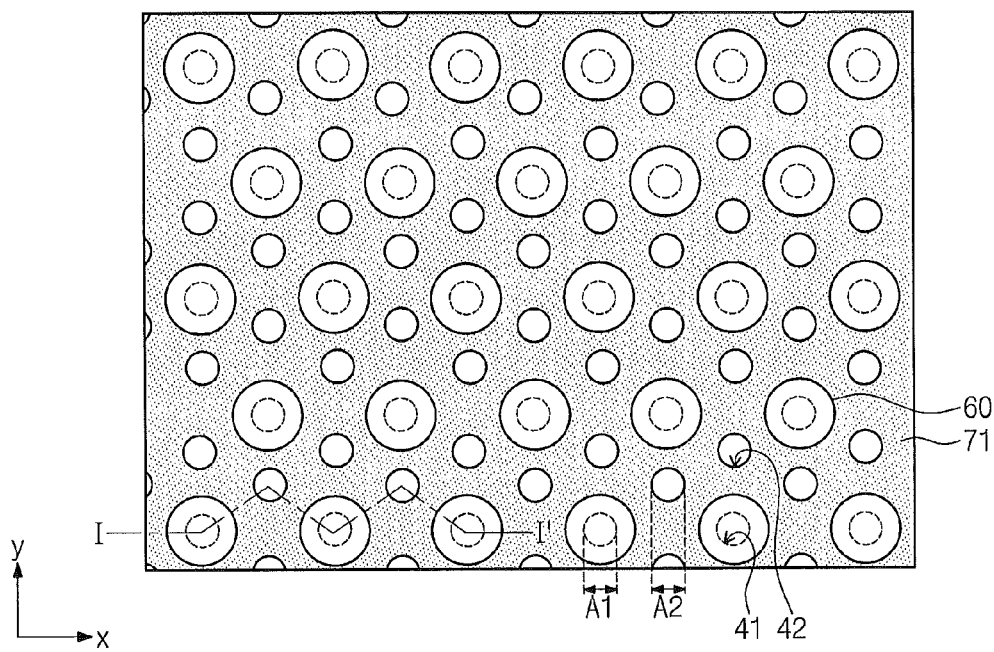
Figure 7B:
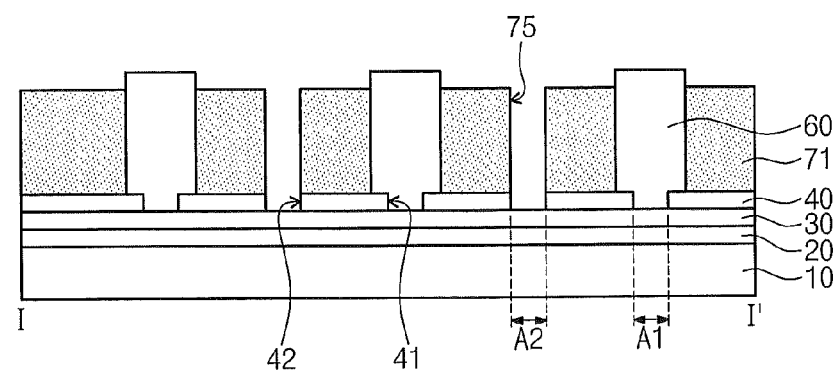

Referring to FIGS. 7A and 7B, portions of the mask layer 40 exposed by the guide openings 75 may be removed to form second openings 42. The removal of the mask layer 40 may be performed using an etching process. The second openings 42 may be formed to expose the etch stop layer 30. Each of the second openings 42 may be shaped like a circle, when viewed in plan view. The second openings 42 may be arranged to have the same or similar arrangement as that of the second block portions 72, when viewed in plan view. For example, the second openings 42 may be disposed to have a honeycomb-shaped arrangement. Each of the second openings 42 may be formed between at least first openings 41 adjacent to each other. The at least three of the first openings 41 may not be disposed on a straight line but be two-dimensionally arranged. A width A2 of the second opening 42 may be substantially the same as a width A1 of the first opening 41.

In the case where a photolithography process is used to form the second openings 42, a width and a pitch of the second openings 42 may be determined by a resolution of the photolithography process. Further, the width and width uniformity of the second openings 42 may be dependent on those of the first openings 41. By contrast, according to example embodiments of the inventive concept, the second openings 42 may be formed using the block copolymer layer 70, and this makes it possible to form the second openings 42 with a reduced dependency on the resolution of the photolithography process and on the width and width uniformity of the first openings 41. Further, according to example embodiments of the inventive concept, it is easy to control the width and width uniformity of the second openings 42. For example, as exemplarily described with reference to FIGS. 5B and 5C, the width of each of the second openings 42 may be controlled by adjusting a width of a corresponding one of the second block portions 72. The mask layer 40 may be used for a process of forming fine patterns. In addition, each of the second openings 42 may be formed to have a circular top shape, compared to the case that it is formed by a photolithography process. Thereafter, the pillars 60 and the first block portion 71 may be removed.

Figure 8A:
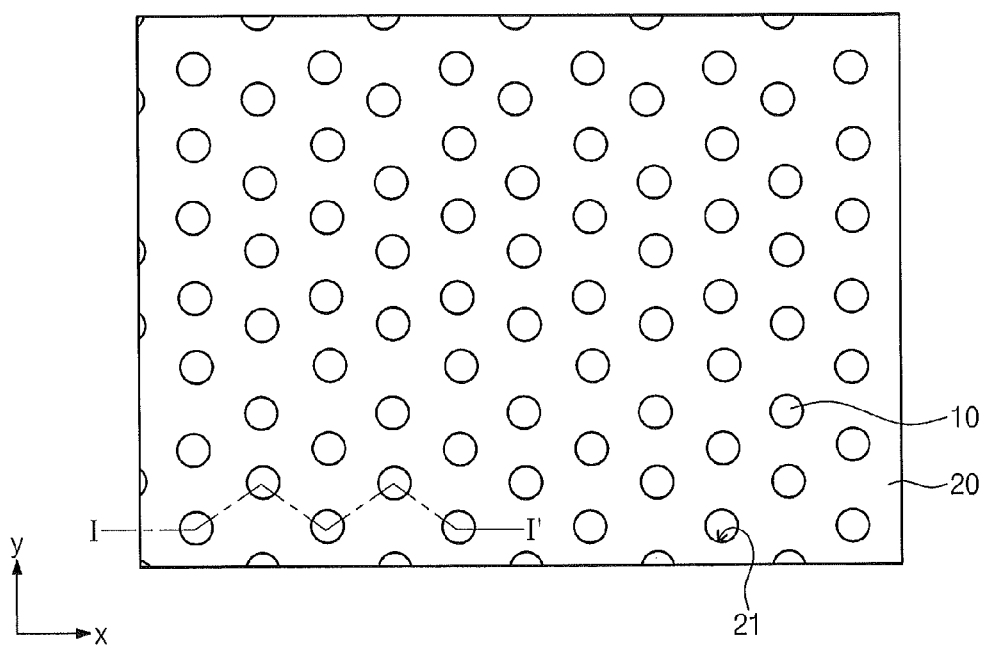
Figure 8B:
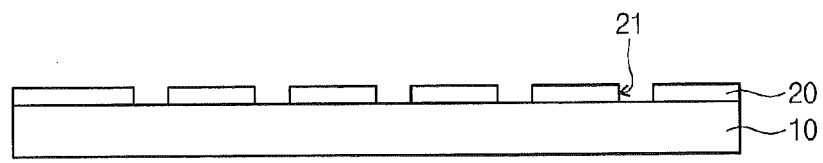

Referring to FIGS. 8A and 8B, the etch stop layer 30 exposed by the first and second openings 41 and 42 may be etched, and the lower layer 20 exposed by the etch stop layer 30 may be etched to have lower openings 21. The lower openings 21 may be formed to have substantially the same width. In the lower layer 20, shapes and arrangement of the lower openings 21 may be defined by the first and second openings 41 and 42. In other words, the lower openings 21 may be formed to have substantially the same or similar shape and arrangement as those of the first and second openings 41 and 42. For example, the lower openings 21 may be disposed to have a zigzag-shaped or honeycomb-shaped arrangement.

The mask layer 40 may be removed. In addition, a space between the lower openings 21 may be smaller than a width or space of a smallest pattern that is formed by only a photolithography process.

FIGS. 9A through 13A are plan views illustrating a patterning method according to other example embodiments of the inventive concept. FIGS. 9B through 13B are sectional views taken along line I-I' of FIGS. 9A through 13A, respectively. For concise description, a previously described element may be identified by a similar or identical reference number without repeating an overlapping description thereof.

Figure 9A:
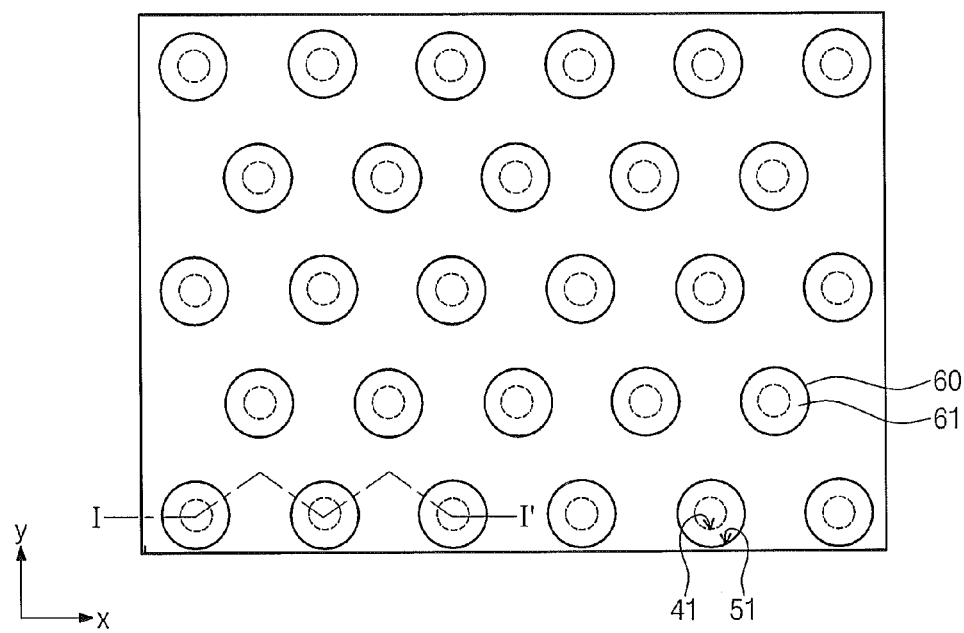
Figure 9B:
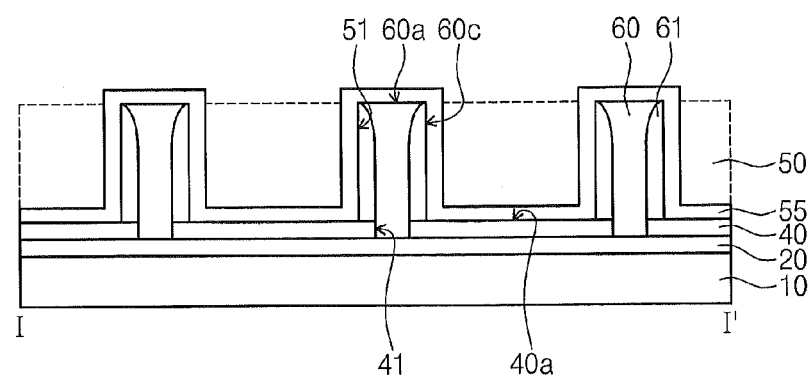

Referring to FIGS. 9A and 9B, the lower layer 20, the mask layer 40 with the first openings 41, the buffer mask layer 50 with the buffer openings 51, and the pillars 60 may be formed on the substrate 10 by a method that is the same as or similar to that of the previous embodiments described with reference to FIGS. 1A through 3B. An etch stop layer (not shown) may be further formed between the lower layer 20 and the mask layer 40. The buffer openings 51 may be formed in the buffer mask layer 50 to expose the mask layer 40. The widths of the first openings 41 may be controlled by forming the spacers 61. In other embodiments, the formation of the spacers 61 may be omitted. Each of the pillars 60 may be formed to fill the first openings 41 and the buffer openings 51 and include a portion protruding from a top surface of the mask layer 40. In certain embodiments, the spacers 61 may be configured to function like the pillars 60. For example, the spacers 61 may be formed of substantially the same material. Thereafter, the buffer mask layer 50 may be removed. A seed layer 55 may be conformally formed to cover the mask layer 40 and the pillars 60. For example, the seed layer 55 may be deposited on the top surface 40a of the mask layer 40 and the top surfaces 60a and sidewalls 60c of the pillars 60. The seed layer 55 may be formed of or include at least one of polymer materials.

Figure 10A:
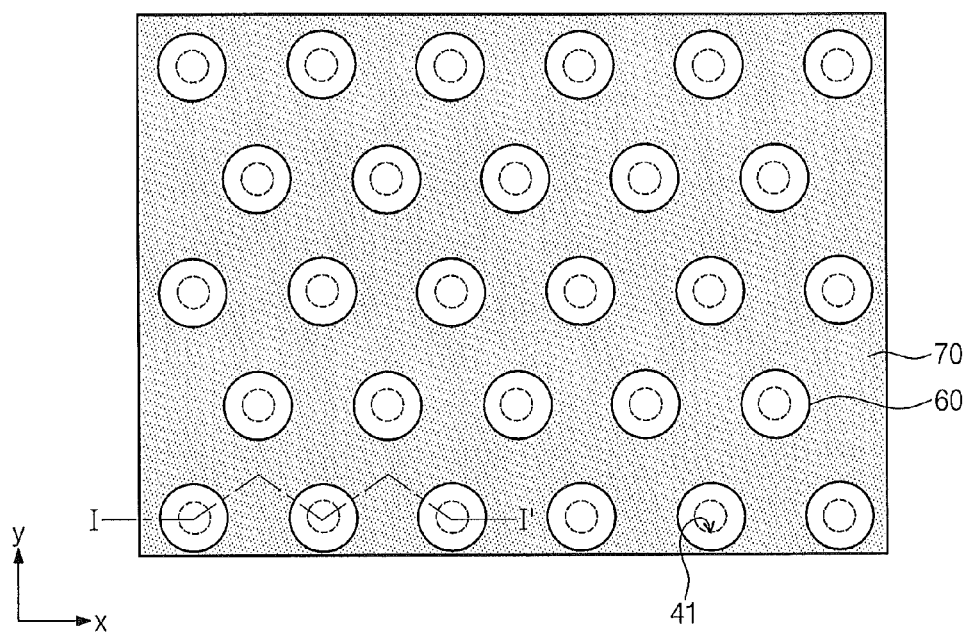
Figure 10B:
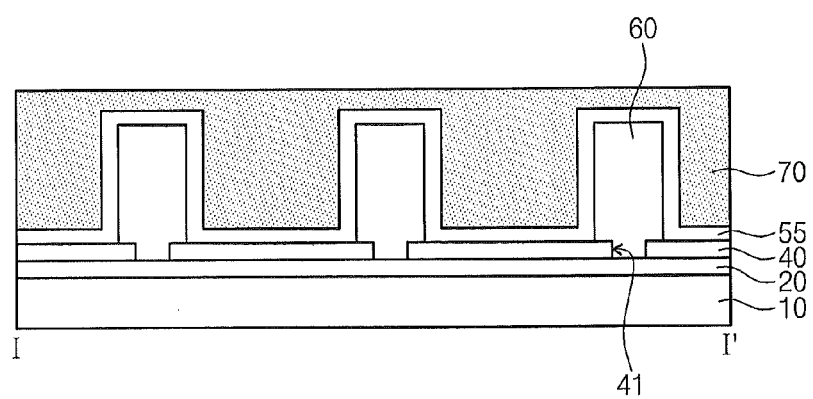

Referring to FIGS. 10A and 10B, the block copolymer layer 70 may be formed on the seed layer 55. The formation of the block copolymer layer 70 may be performed using a method that is the same as or similar to that of the previous embodiments described with reference to FIGS. 4A and 4B.

Figure 11A:
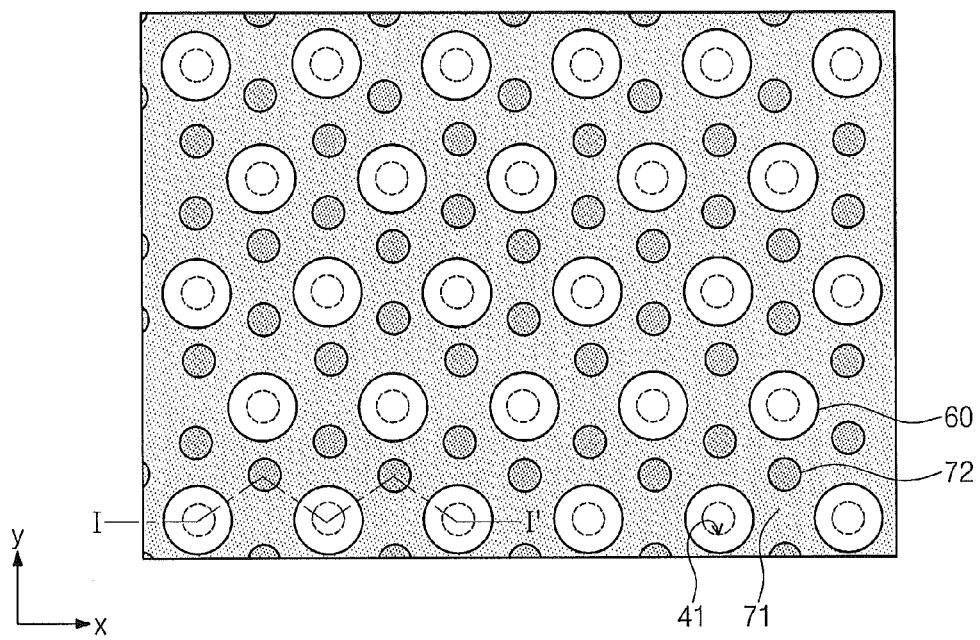
Figure 11B:
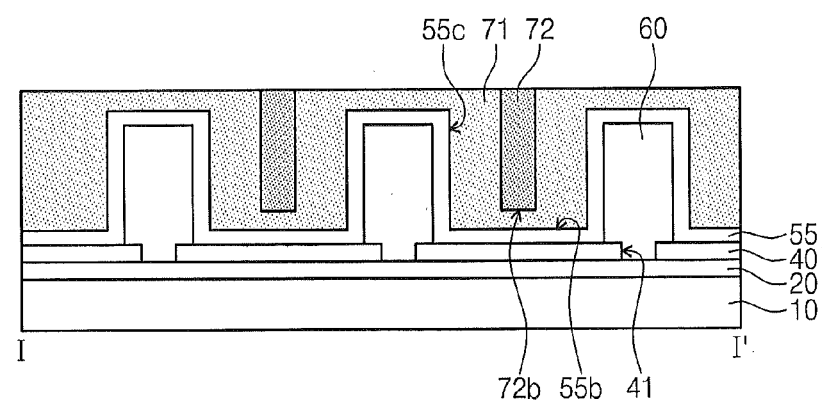

Referring to FIGS. 11A and 11B, the block copolymer layer 70 may be thermally treated to form the first block portion 71 and the second block portions 72. The first block portion 71 may be formed to have a higher affinity for the seed layer 55, compared with the second block portions 72. Accordingly, the first block portion 71 may be conformally formed on the seed layer 55. For example, the first block portion 71 may be provided on sidewalls 55c of the seed layer 55 and include portions interposed between the bottom surfaces 72b of the second block portions 72 and a bottom surface 55b of the seed layer 55. The second block portions 72 may be formed on the first block portion 71 and be spaced apart from the bottom surface 55b of the seed layer 55. Each of the second block portions 72 may be formed between at least adjacent three pillars 60. The width of each of the second block portions 72 may be controlled by the seed layer 55. For example, the width of each of the second block portions 72 may be controlled by adjusting the presence or absence of the seed layer 55 and the thickness of the seed layer 55. In other embodiments, the width of each of the second block portions 72 may be controlled by the method described with reference to FIGS. 5A and 5C.

Figure 12A:
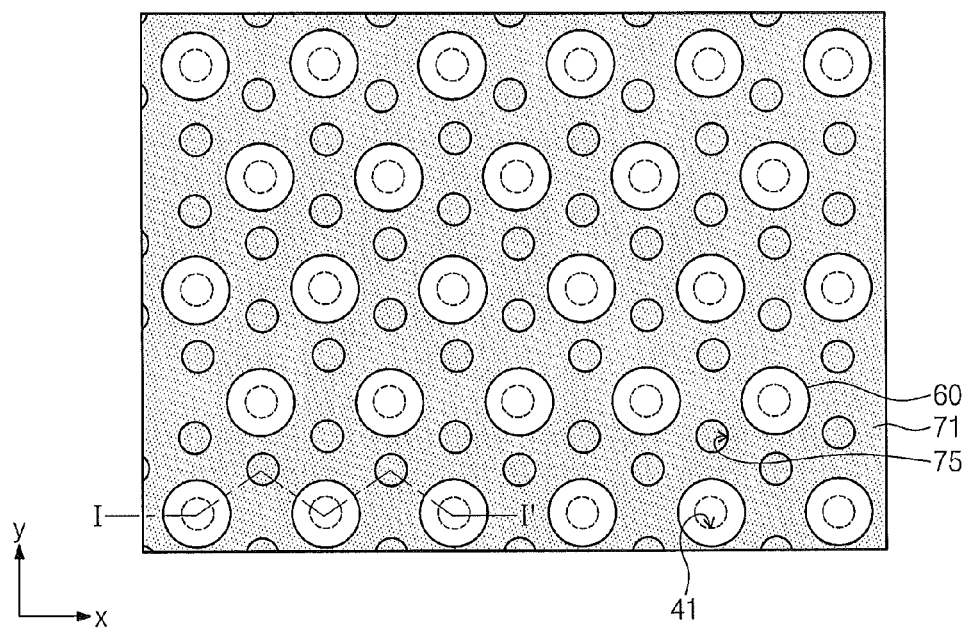
Figure 12B:
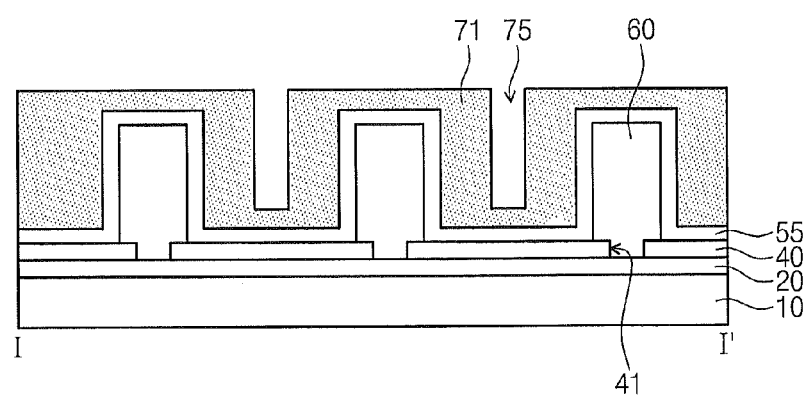

Referring to FIGS. 12A and 12B, the second block portions 72 may be removed to form the guide openings 75 exposing the first block portion 71. The guide openings 75 may be formed using a method that is the same as or similar to that of the previous embodiments described with reference to FIGS. 6A and 6B.

Figure 13A:
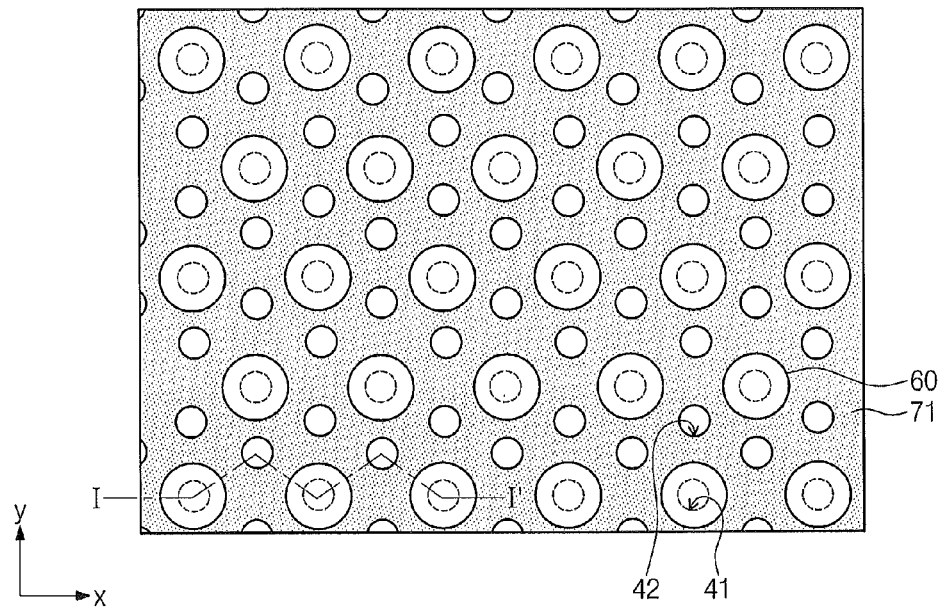
Figure 13B:
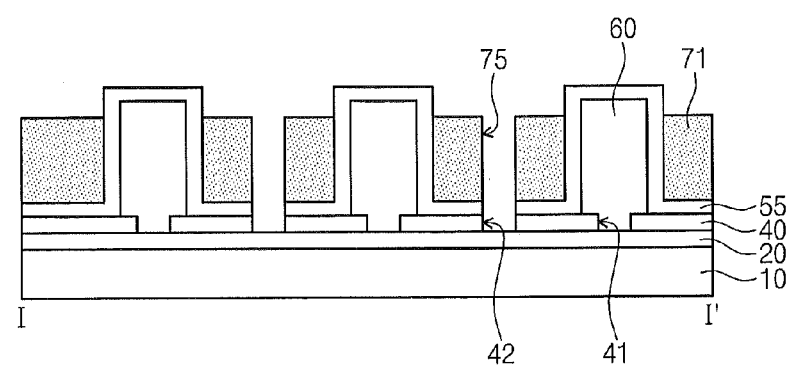

Referring to FIGS. 13A and 13B, the first block portion 71 exposed by the guide openings 75, the seed layer 55, and the mask layer 40 may be sequentially etched to form the second openings 42 in the mask layer 40. The second openings 42 may be formed to expose the lower layer 20. The second openings 42 may be formed using a method that is the same as or similar to that of the previous embodiments described with reference to FIGS. 7A and 7B.

Referring back to FIGS. 8A and 8B, the lower layer 20 exposed by the first and the second openings 41 and 42 may be removed.

FIG. 14A through 16A are plan views illustrating a patterning method according to still other example embodiments of the inventive concept. FIGS. 14B through 16B are sectional views taken along line I-I' of FIGS. 14A through 16A, respectively. For concise description, a previously described element may be identified by a similar or identical reference number without repeating an overlapping description thereof.

Figure 14A:
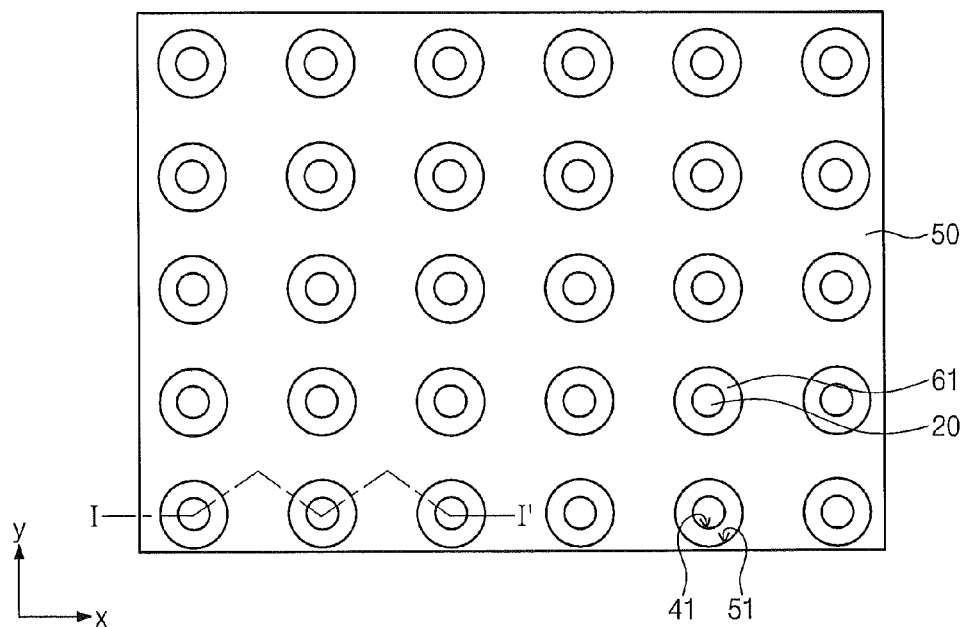
Figure 14B:
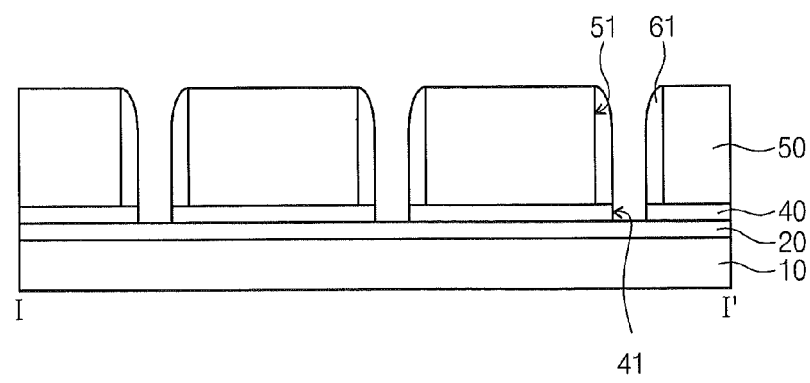

Referring to FIGS. 14A and 14B, the lower layer 20, the mask layer 40 with the first openings 41, and the buffer mask layer 50 with the buffer openings 51 may be sequentially formed on the substrate 10. The lower layer 20, the mask layer 40, and the first openings 41 may be formed using a method that is the same as or similar to that of the previous embodiments described with reference to FIGS. 1A through 2B. An etch stop layer (not shown) may be further formed between the lower layer 20 and the mask layer 40. The first openings 41 may be formed to have a lattice- or checkerboard-shaped arrangement. For example, the first openings 41 may constitute a plurality of rows. Each of the first openings 41 constituting even-numbered rows may be disposed to have the same coordinate in a row direction as that of a corresponding one of the first openings 41 constituting odd-numbered rows. The spacers 61 may be formed in the buffer openings 51, respectively, and this makes it possible to control the widths of the first openings 41. However, in other embodiments, the formation of the spacers 61 may be omitted.

Figure 15A:
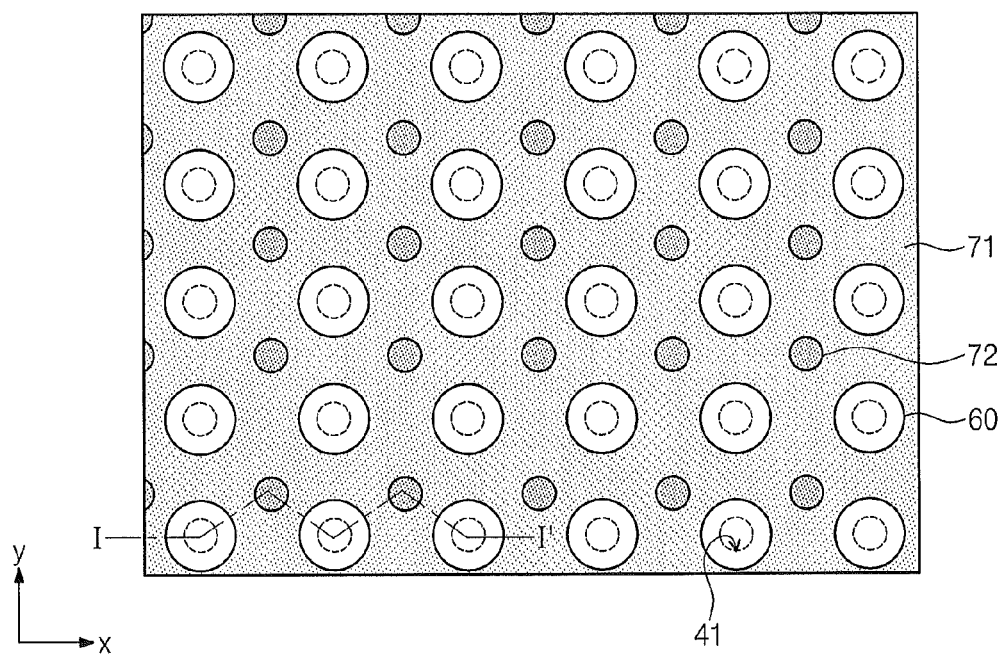
Figure 15B:
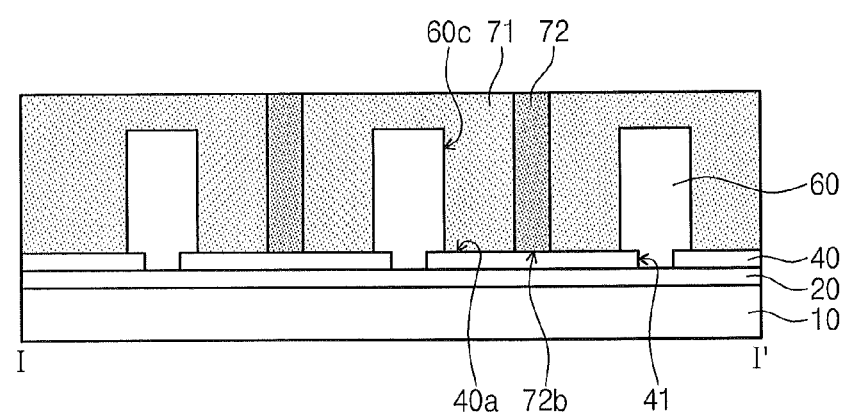

Referring to FIGS. 15A and 15B, the pillars 60 may be formed to fill the first openings 41, respectively. The pillars 60 may be formed to include a portion protruding from the top surface of the mask layer 40. In certain embodiments, the pillars 60 may be disposed to have the lattice- or checkerboard-shaped arrangement that is the same as or similar to that of the first openings 41. The pillars 60 may include a material that is the same as or different from the mask layer 40. Thereafter, the buffer mask layer 50 may be removed. A seed layer (not shown) may be further formed to cover the mask layer 40 and the pillars 60. A block copolymer layer (not shown) may be formed on the substrate 10 to fill a gap region between the pillars 60. Thereafter, a phase separation process may be performed to the block copolymer layer (not shown) to form the first block portion 71 and the second block portions 72. The second block portions 72 may be formed between the pillars 60. The first block portion 71 may be formed between the second block portions 72 and the pillars 60. The first block portion 71 may be formed to enclose the sidewalls 60c of the pillars 60. Alternatively, the first block portion 71 may extend from the sidewalls 60c of the pillars 60 to regions between the bottom surfaces 72b of the second block portions 72 and the top surface 40a of the mask layer 40, as exemplarily described with reference to FIG. 5C. Each of the second block portions 72 may be formed between at least four pillars 60 disposed adjacent to each other. The at least four pillars 60 disposed adjacent to each other may be two-dimensionally arranged. In other words, the four the pillars 60 disposed adjacent to each other may be positioned at vertexes of tetragon (e.g., rectangle). Each of the second block portions 72 may be disposed spaced apart from the at least four pillars 60 adjacent thereto, by substantially the same space. The second block portions 72 may be disposed to have the lattice- or checkerboard-shaped arrangement. Each of the second block portions 72 may be formed to have a circular shape, when viewed in plan view.

Figure 16A:
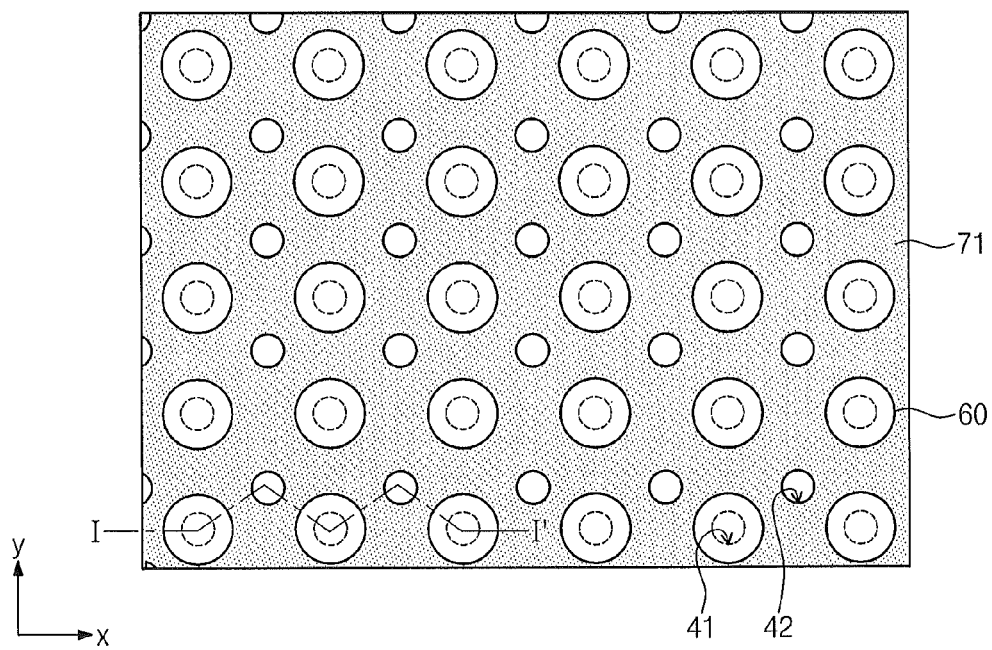
Figure 16B:
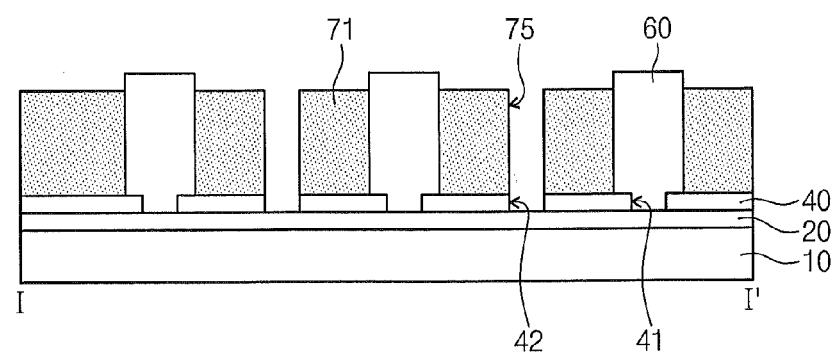

Referring to FIGS. 16A and 16B, the second block portions 72 may be removed to form the guide openings 75 exposing the mask layer 40. The guide openings 75 may be formed using a method that is the same as or similar to that of the previous embodiments described with reference to FIGS. 6A and 6B. The mask layer 40 exposed by the guide openings 75 may be etched to form the second openings 42. The second openings 42 may be formed to expose the lower layer 20. The second openings 42 may be formed using a method that is the same as or similar to that of the previous embodiments described with reference to FIGS. 7A and 7B. Each of the second openings 42 may be formed between at least four first openings 41 disposed adjacent to each other. The at least four first openings 41 disposed adjacent to each other may be two-dimensionally arranged and be not disposed on a straight line. The four first openings 41 disposed adjacent to each other may be positioned at vertexes of tetragon (e.g., rectangle). Each of the second openings 42 may be disposed spaced apart from the at least four first openings 41 adjacent thereto, by substantially the same space. The second openings 42 may be disposed to have the lattice- or checkerboard-shaped arrangement. Each of the first and second openings 41 and 42 may be formed to have a circular shape, when viewed in plan view.

With regard to the arrangements of the first openings 41, example embodiments of the inventive concept will not be limited to the above-described examples and will be variously changed. For example, the first openings 41 may be formed to be positioned at vertexes of polygons (e.g., pentagon, hexagon, and so forth).

Thereafter, as described with reference to FIGS. 8A and 8B, the lower layer 20 may be etched using the mask layer 40 with the first and second openings 41 and 42 as an etch mask.

A method of fabricating a semiconductor device according to example embodiments of the inventive concept will be described below. The patterning method, according to example embodiments of the inventive concept, may be used for the method of fabricating a semiconductor device. Here, the semiconductor device may be one of high-density semiconductor memory devices (e.g., dynamic random access memory (DRAM), static RAM (SRAM), phase change RAM (PRAM), resistance RAM (RRAM), magnetic RAM (MRAM), ferroelectric RAM (FRAM), and FLASH memory), a micro electro mechanical systems (MEMS) device, an optoelectronic device, or a process (e.g., CPU or DSP). In example embodiments, the semiconductor device may include semiconductor chips of the same or different kind.

Hereinafter, semiconductor memory devices fabricated by a patterning method according to example embodiments of the inventive concept will be described with reference to FIGS. 17 through 19.

Figure 17:
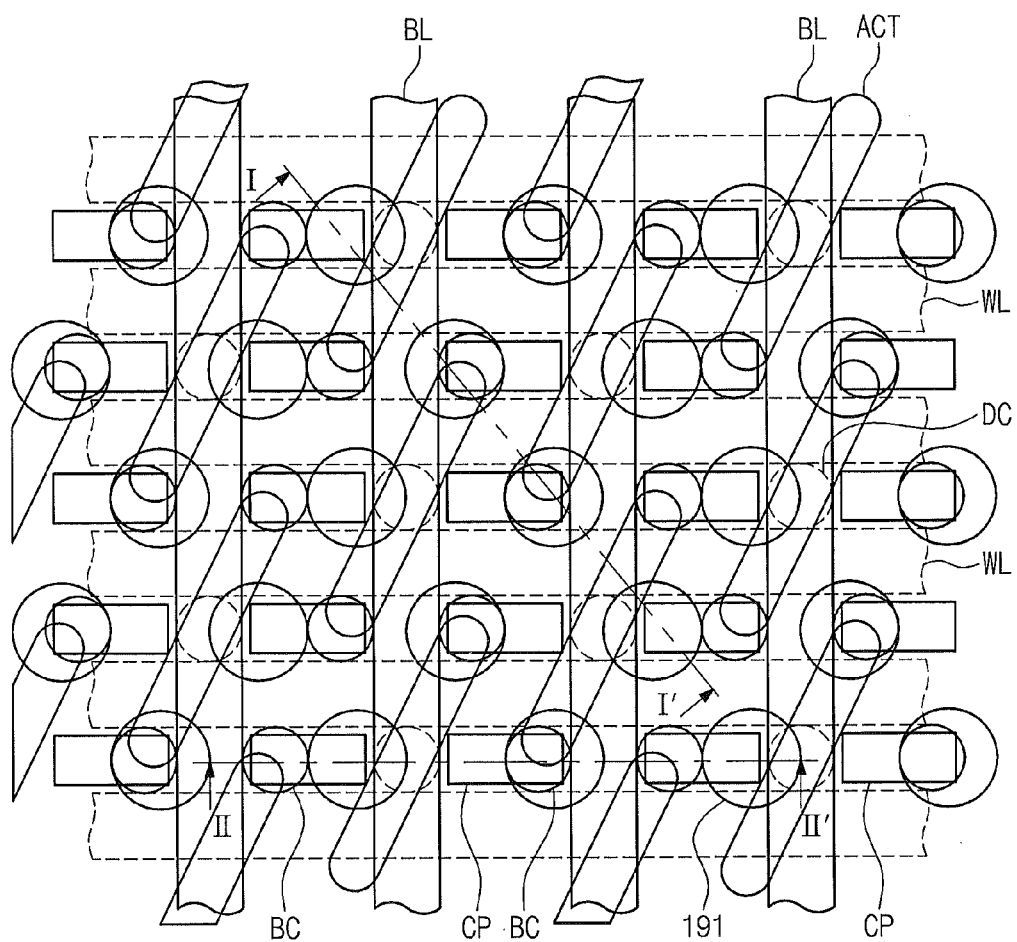
FIG. 17 is a plan view of a semiconductor memory device fabricated by a patterning method according to example embodiments of the inventive concept.

FIG. 17 is a plan view of a semiconductor memory device fabricated by a patterning method according to example embodiments of the inventive concept. FIGS. 18 and 19 are sectional views taken along lines I-I' and II-IP of FIG. 17 to illustrate the fabricating method including a patterning method according to example embodiments of the inventive concept.

Figure 18:
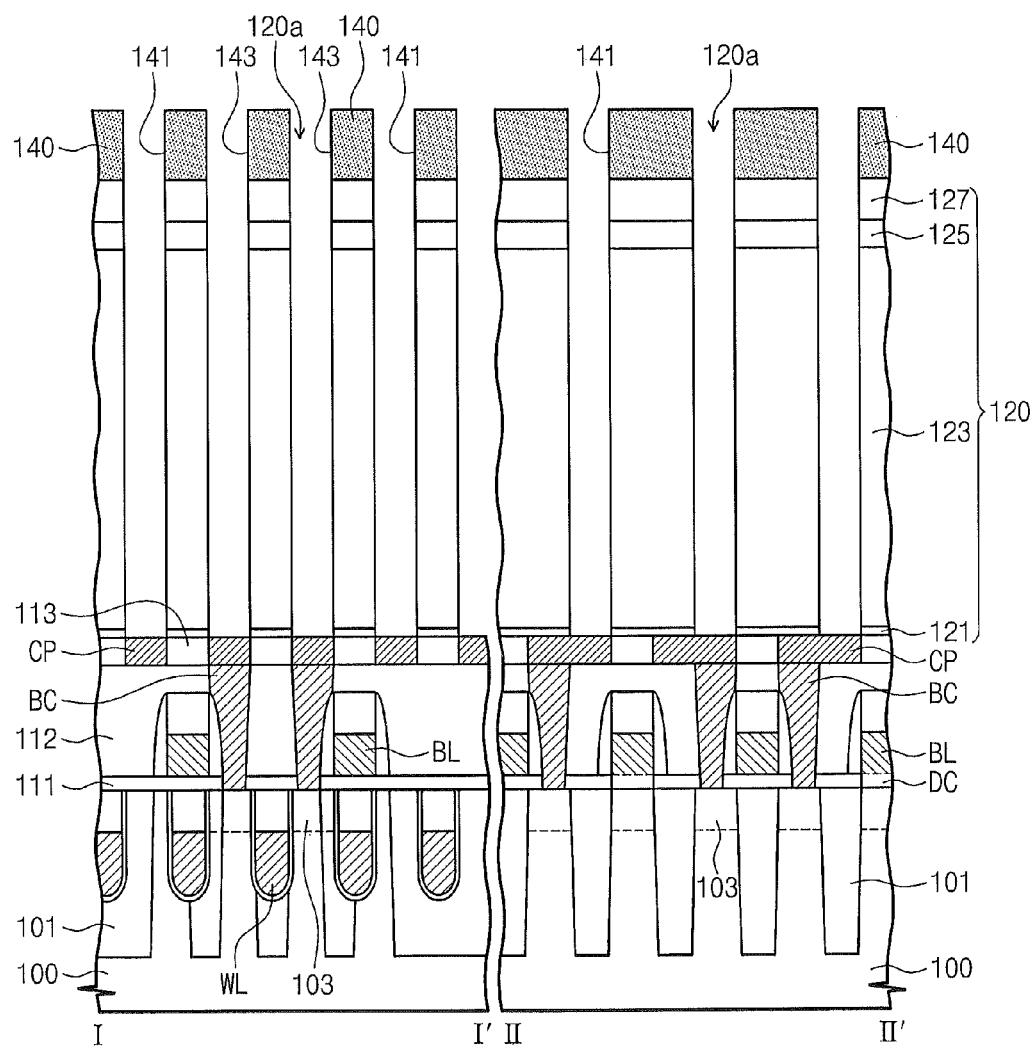
FIGS. 18 and 19 are sectional views taken along lines I-I' and II-IP of FIG. 17 to illustrate the fabricating method including a patterning method according to example embodiments of the inventive concept.

Referring to FIGS. 17 and 18, a semiconductor memory device may include word lines WL, bit lines BL crossing the word lines WL, and memory cells provided at intersections between the word lines WL and the bit lines BL.

For example, a device isolation layer 101 may be formed on a semiconductor substrate 100 to define active regions ACT. The active regions ACT may be formed to have a bar shape. Further, the active regions ACT may be formed in such a way that its major axis is at an angle to both of the word lines WL and the bit lines BL.

The word lines WL may be provided to cross the active regions ACT. In some embodiments, a recess region may be formed in a top surface of the semiconductor substrate 100, and the word lines WL may be provided in the recess region with a gate insulating layer interposed therebetween. Further, the word lines WL may have a top surface that is lower than that of the semiconductor substrate 100, and an insulating material may be formed to fill a remaining portion of the recess region provided with the word line WL.

Source and drain regions 103 may be formed in portions of the active region ACT located at both sides of each word line WL. The source and drain regions 103 may be doped regions.

The word lines WL and the source and drain regions 103 may constitute a plurality of MOS transistors that are integrated on the semiconductor substrate 100.

The bit lines BL may be provided on the semiconductor substrate 100 to cross the word lines WL. A first interlayered insulating layer 111 may be interposed between the bit lines BL and the semiconductor substrate 100, and bit line contact plugs DC may be formed through the first interlayered insulating layer 111 to connect the source and drain regions 103 electrically with the bit line BL.

A second interlayered insulating layer 112 may be formed to cover the bit lines BL, and contact plugs BC may be formed through the second interlayered insulating layer 112 to connect memory elements or data storing elements electrically with the source and drain regions 103. In example embodiments, the contact plugs BC may be provided on the active region ACT at both sides of the bit line BL.

The formation of the contact plugs BC may include patterning the second interlayered insulating layer 112 to form contact holes exposing the source and drain regions 103, forming a conductive layer to fill the contact holes, and then, planarizing the conductive layer. The contact plug BC may be formed of at least one of a doped polysilicon layer, a metal layer, a metal nitride layer, or a metal silicide layer.

In some embodiments, contact pads CP may be formed on the contact plugs BC, respectively. The contact pads CP may be two-dimensionally arranged on the second interlayered insulating layer 112. Due to the presence of the contact pads CP, a lower electrode of a capacitor provided thereon can be connected to the contact plugs BC therebelow with an increased contact area. For example, a pair of the contact pads CP, which are provided to be adjacent to each other at both sides of the bit line BL, may be extended toward opposite directions.

Thereafter, a mold layer 120 may be formed on a third interlayered insulating layer 113, in which the contact pads CP are provided. A thickness of the mold layer 120 may be changed depending on a thickness of a lower electrode of a cylindrical capacitor or a desired capacitance of the capacitor.

In example embodiments, the mold layer 120 may include an etch stop layer 121, a lower mold layer 123, a supporting layer 125, and an upper mold layer 127, which may be sequentially stacked on the third interlayered insulating layer 113. In certain embodiments, the lower and upper mold layers 123 and 127 may be formed of silicon oxide, and the etch stop layer 121 and the supporting layer 125 may be formed of a material having an etch selectivity with respect to the lower and upper mold layers 123 and 127, in a dry etching process on the mold layers 120. For example, the etch stop layer 121 and the supporting layer 125 may be formed of silicon nitride.

Referring to FIG. 18, first and second openings 141 and 143 may be formed in a mask layer 140. The mold layer 120 may be etched using the hard mask layer 140 with the first and second openings 141 and 143 as an etch mask. Accordingly, lower holes 120a may be formed through the mold layer 120 to expose the contact pads CP. The lower holes 120a may be disposed to have a zigzag-shaped or honeycomb-shaped arrangement, as exemplarily described with reference to FIG. 8A.

Figure 19:
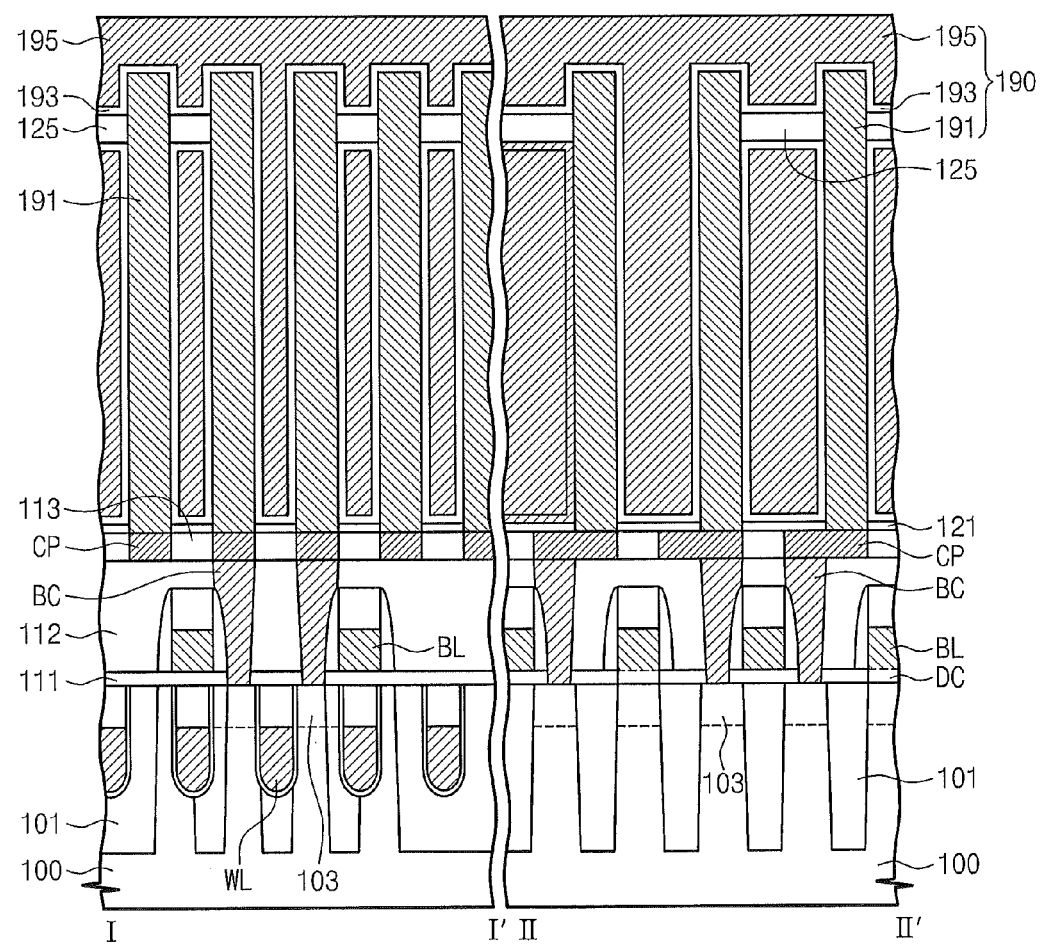

Thereafter, referring to FIGS. 17 and 19 in conjunction with FIG. 18, lower electrodes 191 may be formed in the lower holes 120a, respectively. The formation of the lower electrodes 191 may include depositing a conductive layer to cover conformally inner surfaces of the lower holes 120a, and then, removing the conductive layer from a top surface of the mold pattern 120. Accordingly, the lower electrode 191 may be formed to have a cylindrical shape in the lower hole 120a. The lower electrodes 191 may be electrically connected to the contact pads CP, respectively. The lower electrodes 191 may be arranged to have a zigzag-shaped or honeycomb-shaped arrangement. After the formation of the lower electrodes 191, the lower and upper mold layers 123 and 125 may be selectively removed to expose sidewalls of the lower electrodes 191. Thereafter, a dielectric layer 193 may be formed to cover conformally surfaces of the lower electrodes 191, and an upper electrode 195 may be formed on the dielectric layer 193. In certain embodiments, the lower electrode 191, the upper electrode 195, and the dielectric layer 193 interposed therebetween may constitute a capacitor 190, which may be used for a memory element of the semiconductor device.

Figure 20:
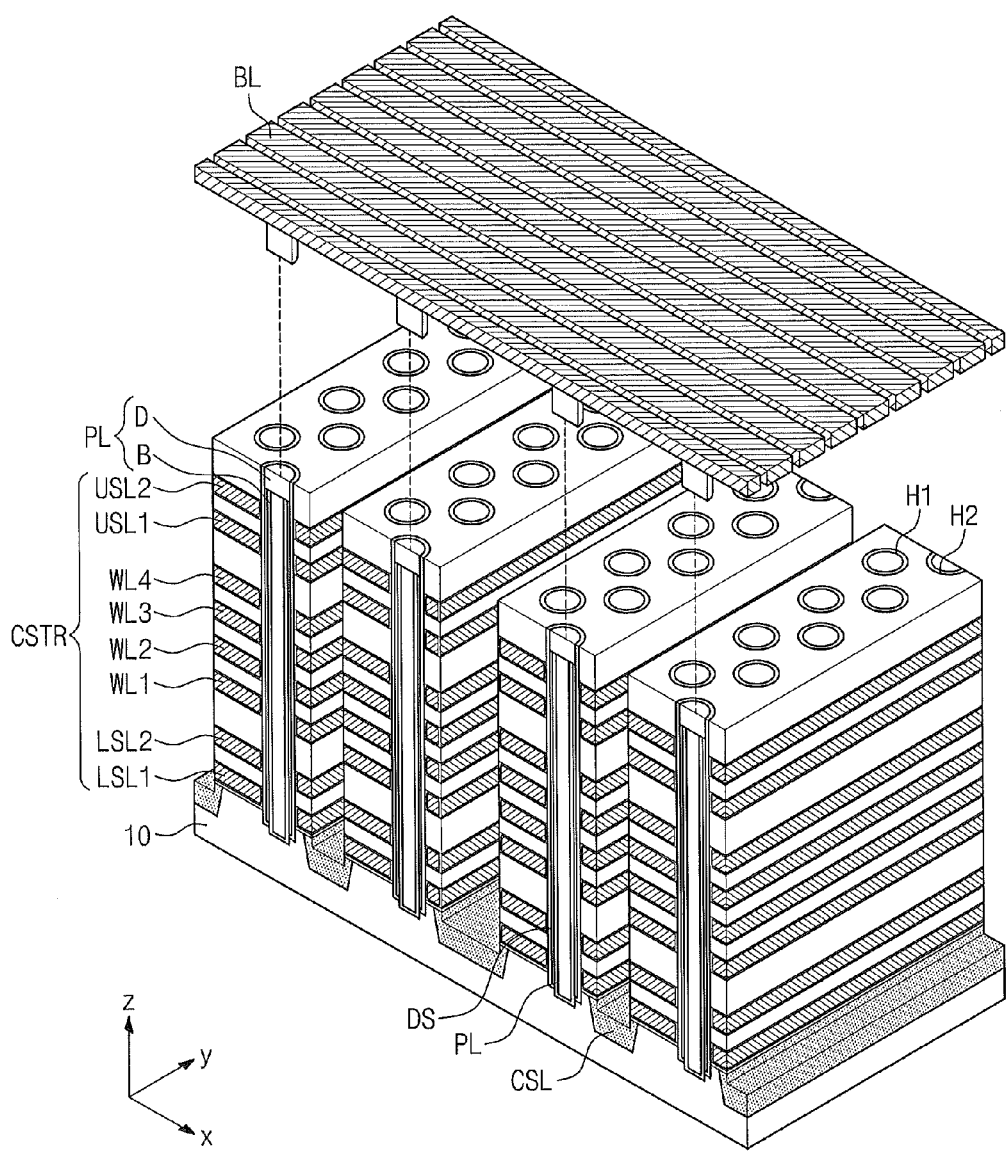
FIG. 20 is a perspective view illustrating a three-dimensional semiconductor memory device, which may be fabricated by a patterning method according to example embodiments of the inventive concept.

FIG. 20 is a perspective view illustrating a three-dimensional semiconductor memory device, which may be fabricated by a patterning method according to example embodiments of the inventive concept.

Referring to FIG. 20, the three-dimensional semiconductor memory device may include a common source line CSL, a plurality of bit lines BL, and a plurality of cell strings CSTR disposed between the common source line CSL and the bit lines BL.

The common source line CSL may be a conductive pattern provided on the substrate 10 or a doped region provided in the substrate 10. The bit lines BL may be conductive patterns (for example, metal lines) that are provided spaced apart from the substrate 10. The bit lines BL may be two-dimensionally arranged, and a plurality of the cell strings CSTR may be connected in parallel to each of the bit lines BL. In other words, the cell strings CSTR may be two-dimensionally arranged on the common source line CSL or the substrate 10.

Each of the cell strings CSTR may include a plurality of lower selection lines LSL1 and LSL2, a plurality of word lines WL1-WL4, and a plurality of upper selection lines USL1 and USL2 that are disposed between the common source line CSL and the bit lines BL. The lower selection lines LSL1 and LSL2, the word lines WL1-WL4, and the upper selection lines USL1 and USL2 may be conductive patterns that are sequentially stacked on the substrate 10.

Further, each of the cell strings CSTR may include a semiconductor pillar PL vertically extending from the substrate 10 to be connected to the bit line BL. The semiconductor pillars PL may be formed to penetrate the lower selection lines LSL1 and LSL2, the word lines WL1-WL4, and the upper selection lines USL1 and USL2. In other words, the semiconductor pillars PL may penetrate the plurality of the conductive patterns stacked on the substrate 10. Furthermore, the semiconductor pillar PL may include a body portion B and doped region(s) formed in at least one of both end portions of the body portion B. For example, a drain region D may be formed in an uppermost portion of the semiconductor pillar PL (or between the body portion B and the bit line BL).

A data storing layer DS may be disposed between the word lines WL1-WL4 and the semiconductor pillars PL. In example embodiments, the data storing layer DS may be a charge storing layer. For example, the data storing layer DS may be one of an insulating charge-trap layer, a floating gate electrode, or an insulating layer with conductive nano dots.

A dielectric layer, which serves as a gate insulating layer of a transistor, may be provided between the lower selection line LSL1 and LSL2 and the semiconductor pillars PL or between the upper selection lines USL1 and USL2 and the semiconductor pillar PL. In certain embodiments, the dielectric layer may be formed of the same material as the data storing layer DS. For example, the dielectric layer may be a material (e.g., a silicon oxide layer) used for a gate insulating layer of conventional MOSFET.

In this structure, the semiconductor pillars PL may constitute metal-oxide-semiconductor field effect transistors (MOSFETs), along with the lower selection lines LSL1 and LSL2, the word lines WL1-WL4, and the upper selection lines USL1 and USL2. Here, the semiconductor pillars PL may serve as channel or active regions for the MOSFETs. Alternatively, the semiconductor pillars PL may constitute MOS capacitors, along with the lower selection lines LSL1 and LSL2, the word lines WL1-WL4, and the upper selection lines USL1 and USL2. In example embodiments, the cell string CSTR may be configured in such a way that lower and upper selection transistors controlled by the lower and upper selection lines LSL1, LSL2, USL1, and USL2 are connected in series to cell transistors controlled by the word lines WL1-WL4.

In the three-dimensional semiconductor memory device with the semiconductor pillars PL, the semiconductor pillars PL may be formed using the patterning method, according to example embodiments of the inventive concept.

In more detail, the lower selection lines LSL1 and LSL2, the word lines WL1-WL4, and the upper selection lines USL1 and USL2 may constitute a stack with insulating and conductive layers alternatingly stacked on the substrate 10. Here, the stack may correspond to the underlying layer described with reference to FIGS. 1B through 16B. Holes H1 and H2 may be formed to penetrate at least a portion of the stack using a mask layer with first and second openings. The hard mask layer with the first and second openings may be formed using a method that is the same as or similar to one of those of the previous embodiments described with reference to FIGS. 1A through 8B, FIGS. 9A through 13B, or FIGS. 14A through 16B. The holes H1 and H2 may be formed to have a zigzag-shaped or honeycomb-shaped arrangement, as previously described in the methods of forming patterns. Thereafter, the data storing layer DS and the semiconductor pillars PL may be formed in the holes H1 and H2.

Figure 21:
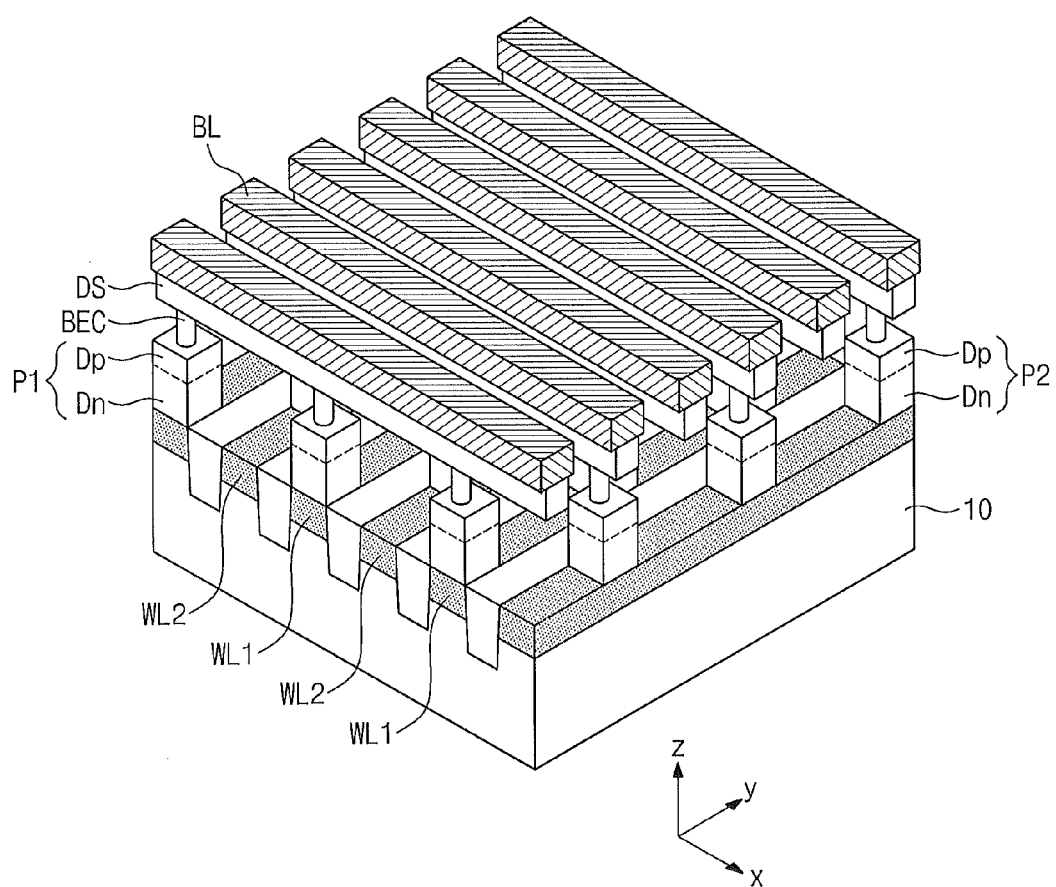
FIG. 21 is a perspective view illustrating a variable resistance memory device, which may be fabricated by a patterning method according to example embodiments of the inventive concept.

FIG. 21 is a perspective view illustrating a variable resistance memory device, which may be fabricated by a patterning method according to example embodiments of the inventive concept.

Referring to FIG. 21, the variable resistance memory device may include the semiconductor substrate 10, lower interconnection lines WL1 and WL2 on the semiconductor substrate 10, upper interconnection lines BL crossing the lower interconnection lines WL1 and WL2, selection devices provided at intersections between the lower interconnection lines WL1 and WL2 and the upper interconnection lines BL, and memory elements DS provided between the selection devices and the upper interconnection lines BL. The selection devices may be two-dimensionally arranged on the semiconductor substrate 10 to control a flow of an electric current passing through the memory element DS.

In detail, each of the lower interconnection lines WL1 and WL2 may be shaped like a line extending along a y-axis on the semiconductor substrate 10. In some embodiments, the lower interconnection lines WL1 and WL2 may be impurity regions that are formed by highly doping the semiconductor substrate 10 with impurities. Here, the lower interconnection lines WL1 and WL2 may be doped to have a different conductivity type from the semiconductor substrate 10.

In the present embodiment, the selection devices may include semiconductor patterns P1 and P2, which may be formed by the afore-described patterning method. For example, the formation of the semiconductor patterns P1 and P2 may include a pattering process, in which the mask layer with the first and second openings is used as an etch mask. Accordingly, the semiconductor patterns P1 and P2 may be formed on the semiconductor substrate 10 to have a zigzag-shaped or honeycomb-shaped arrangement.

Each of the first and second semiconductor patterns P1 and P2 may include an upper doped region Dp and a lower doped region Dn that have different conductivity types from each other. For example, the lower doped region Dn may have the same conductivity type as that of the lower interconnection lines WL1 and WL2, while the upper doped region Dp may have a different conductivity type from that of the lower doped region Dn. Accordingly, a PN junction may be formed in each of the first and second semiconductor patterns P1 and P2. In other embodiments, an intrinsic region may be provided between the upper doped region Dp and the lower doped region Dn, and thus, a PN junction may be formed in each of the first and second semiconductor patterns P1 and P2. In certain embodiments, the semiconductor substrate 10, the lower interconnection line WL, and the first and second semiconductor patterns P1 and P2 may be configured to form a PNP or NPN bipolar transistor.

Lower electrodes BEC, memory elements DS, and upper interconnection lines BL may be provided on the first and second semiconductor patterns P1 and P2. The upper interconnection lines BL may be provided to cross the lower interconnection lines WL1 and WL2 on the memory elements DS and connect the memory elements DS electrically to each other.

In example embodiments, each of the memory elements DS may be formed to be substantially parallel to the upper interconnection lines BL and be connected to a plurality of the lower electrodes BEC. Alternatively, the memory elements DS may be provided to have a two-dimensional arrangement. For example, each of the memory elements DS may be provided on the corresponding one of the first and second semiconductor patterns P1 and P2. The memory elements DS may be a variable resistance pattern, whose resistance can be reversibly changed using an electric pulse applied thereto. In example embodiments, the memory element DS may include a phase-change material, whose crystalline state can be changed by an amount of electric current passing through the memory element DS. In other embodiments, the memory element DS may include at least one of perovskite compounds, transition metal oxides, magnetic materials, ferromagnetic materials, or antiferromagnetic materials.

Each of the lower electrodes BEC may be provided between the corresponding one of the first and second semiconductor patterns P1 and P2 and the corresponding one of the memory elements DS. In plan view, the lower electrode BEC may have an area that is smaller than that of each of the first and second semiconductor patterns P1 and P2 or that of each memory element DS.

In some embodiments, the lower electrodes BEC may be formed to have a pillar-shaped structure. In other embodiments, a structure of the lower electrode BEC may be variously modified to have a reduced sectional area. For example, the lower electrode BEC may be shaped like the letter 'U', the letter 'L', the hollow circular pillar, a ring, or a cup.

Further, an ohmic layer may be provided between the lower electrodes BEC and the first and second semiconductor patterns P1 and P2 to decrease a contact resistance therebetween. For example, the ohmic layer may include metal silicides, such as titanium silicide, cobalt silicide, tantalum silicide, and tungsten silicide.

According to example embodiments of the inventive concept, the mask layer with the first and second openings may be used in a patterning process. The first openings may be formed by performing an etching process to the buffer opening with the spacers. A width of each of the first openings may be controlled by adjusting a thickness of a corresponding one of the spacers. Further, widths and width uniformity of the second openings can be easily controlled by adjusting a process condition in a process of forming the pillars and the block copolymer layer. Accordingly, the mask layer can be used to form fine patterns.

While example embodiments of the inventive concepts have been particularly shown and described, it will be understood by one of ordinary skill in the art that variations in form and detail may be made therein without departing from the spirit and scope of the attached claims.

What is claimed is:

1. A patterning method, comprising:
   sequentially forming a lower layer and a mask layer on a substrate, the mask layer having first openings;
   forming pillars to fill the first openings and protrude upward from a top surface of the mask layer;
   forming a block copolymer layer on the substrate with the pillars;
   performing a thermal treatment to the block copolymer layer to form a first block portion and second block portions, each of the second block portions being formed between the pillars, and the first block portion being formed between the pillars and the second block portions;
   removing the second block portions to form guide openings exposing the mask layer; and
   etching the mask layer exposed by the guide openings to form second openings.

2. The method of claim 1, wherein each of the second openings is formed between at least three of the first openings disposed adjacent to each other, and the at least three of the first openings are two-dimensionally arranged.

3. The method of claim 2, wherein each of the second openings is spaced apart from the at least three of the first openings adjacent thereto, by substantially the same space.

4. The method of claim 2, wherein the at least three of the first openings are formed to be positioned at vertexes, respectively, of a triangle.

5. The method of claim 2, wherein the at least three of the first openings comprises four first openings positioned at vertexes, respectively, of a tetragon.

6. The method of claim 1, further comprising etching the lower layer exposed by the mask layer.

7. The method of claim 1, wherein forming the mask layer comprises:
   forming the mask layer on the lower layer;

forming a buffer mask layer having buffer openings, on the mask layer;

forming spacers on sidewalls of the buffer openings; and etching portions of the mask layer exposed by the buffer openings provided with the spacers to form the first openings in the mask layer.

8. The method of claim 1, wherein forming the pillars comprises:

forming a pillar layer to fill the buffer openings and the first openings;

planarizing the pillar layer to expose the buffer mask layer and form the pillars; and removing the buffer mask layer.

9. The method of claim 1, further comprising forming a seed layer on the substrate with the pillars, before the forming of the block copolymer layer, wherein the seed layer is formed to cover conformally a top surface of the mask layer and sidewalls of the pillars.

10. The method of claim 1, wherein the second block portions are formed spaced apart from a top surface of the mask layer, and the first block portion is extended to between bottom surfaces of the second block portions and the top surface of the mask layer.

11. The method of claim 1, wherein the second openings are formed to have substantially the same shape as, the first openings.

12. The method of claim 1, wherein each of the second openings is formed to have a circular shape.

13. The method of claim 1, wherein the second block portions comprise a material different from the first block portion, and the first block portion is formed to enclose the pillars.

14. A patterning method, comprising:

sequentially forming a lower layer, a mask layer and a buffer mask layer on a substrate, the buffer mask layer having buffer openings;

forming spacers on inner sidewalls of the buffer openings;

etching portions of the mask layer exposed by the spacers in the buffer openings to form first openings in the mask layer;

forming pillars to fill the first openings and the buffer openings between the spacers;

removing the buffer mask layer;

forming a first block copolymer portion to fill gap regions on the mask layer between outer sidewalls of the spacers;

forming second block copolymer portions of a material different than the first block copolymer portion at equal distances from the pillars; and removing the second block copolymer portions to form guide openings exposing the mask layer.

15. The method of claim 14, wherein forming the pillars comprises:

filling the buffer openings and the first openings with a pillar layer; and planarizing the pillar layer to expose the buffer mask layer and top surfaces of the pillars.

16. The method of claim 14, wherein a closest three of the pillars to each of the second block copolymer portions are not disposed in a straight line.

17. The method of claim 16, wherein top surfaces of the second block copolymer portions are circular in shape, and wherein the second block copolymer portions are surrounded by the first block copolymer portion and two-dimensionally arranged to be positioned at vertexes of at least one of a triangle pattern and a hexagon pattern.

18. The method of claim 14, further comprising:

forming a seed layer comprising polymer materials conformally on a top surface of the mask layer, top surfaces of the pillars and outer sidewalls of the spacers; and forming the first block copolymer portion on the seed layer.

19. A patterning method, comprising:

sequentially forming a lower layer and a mask layer on a substrate, the mask layer having first openings with spacers on both sides of the first openings;

forming pillars to fill the first openings and protrude upward from a top surface of the mask layer;

forming a seed layer comprising polymer materials conformally on a top surface of the mask layer, top surfaces of the pillars and outer sidewalls of the spacers;

forming a first block copolymer portion on the seed layer to fill gap regions on the seed layer between the outer sidewalls of the spacers;

forming second block copolymer portions different than the first block copolymer portion at equal distances from the pillars; and removing the second block copolymer portions to form guide openings exposing the mask layer.

20. The method of claim 19, wherein the second block copolymer portions are formed spaced apart from a top surface of the seed layer, and a portion of the first block copolymer portion extends between bottom surfaces of the second block copolymer portions and the top surface of the seed layer.

* * * * *